(12) United States Patent
Choi et al.

(10) Patent No.: US 12,239,001 B2
(45) Date of Patent: Feb. 25, 2025

(54) DISPLAY DEVICE

(71) Applicant: Samsung Display Co., LTD., Yongin-si (KR)

(72) Inventors: Chung Sock Choi, Seoul (KR); Sun Ho Kim, Seongnam-si (KR); Hye Won Kim, Seoul (KR); Sun Hee Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 83 days.

(21) Appl. No.: 17/876,084

(22) Filed: Jul. 28, 2022

(65) Prior Publication Data

US 2023/0108247 A1 Apr. 6, 2023

(30) Foreign Application Priority Data

Oct. 1, 2021 (KR) .................. 10-2021-0130778

(51) Int. Cl.
*H10K 59/40* (2023.01)
*G06F 3/044* (2006.01)
(Continued)

(52) U.S. Cl.
CPC .......... *H10K 59/40* (2023.02); *G06F 3/0445* (2019.05); *G06F 3/0446* (2019.05); *H10K 50/86* (2023.02);
(Continued)

(58) Field of Classification Search
CPC .... H10K 59/40; H10K 50/86; H10K 59/1213; H10K 59/123; H10K 59/38;
(Continued)

(56) References Cited

U.S. PATENT DOCUMENTS

| 11,880,235 B2 * | 1/2024 | Bushnell ............... G06F 1/1609 |
| 2013/0002133 A1 * | 1/2013 | Jin ....................... H10K 59/128 |
| | | 313/511 |

(Continued)

FOREIGN PATENT DOCUMENTS

| CN | 113327543 | 8/2021 |
| CN | 113437126 | 9/2021 |

(Continued)

OTHER PUBLICATIONS

Extended European Search Report for European Application No. 22198262.2. dated Mar. 6, 2023.

*Primary Examiner* — Benyam Ketema
(74) *Attorney, Agent, or Firm* — KILE PARK REED & HOUTTEMAN PLLC

(57) ABSTRACT

A display device includes a display area including a first display area and a second display area adjacent to each other; a driving circuit, at least part of the driving circuit being disposed in the second display area; first pixel circuit units disposed in the first display area; first light emitting elements disposed in the first display area and electrically connected to the first pixel circuit units; second pixel circuit units disposed in the second display area; second light emitting elements disposed in the second display area and two or more of the second light emitting elements are electrically connected to a second pixel circuit unit; and a light blocking layer overlapping at least one of the second light emitting elements in a plan view.

22 Claims, 15 Drawing Sheets

(51) Int. Cl.
*H01L 27/12* (2006.01)
*H10K 50/86* (2023.01)
*H10K 59/121* (2023.01)

(52) U.S. Cl.
CPC ............... *G06F 2203/04111* (2013.01); *G06F 2203/04112* (2013.01); *H01L 27/124* (2013.01); *H10K 59/1213* (2023.02)

(58) Field of Classification Search
CPC .. H10K 59/351; H10K 59/352; H10K 59/353; H10K 59/8792; H10K 59/121; G06F 3/0445; G06F 3/0446; G06F 2203/04111; G06F 2203/04112; G06F 3/0412; H01L 27/124
See application file for complete search history.

(56) References Cited

U.S. PATENT DOCUMENTS

| | | | | |
|---|---|---|---|---|
| 2014/0300649 | A1* | 10/2014 | Park | G09G 3/3208 345/690 |
| 2016/0066409 | A1* | 3/2016 | Kwon | H01L 27/1218 174/254 |
| 2016/0268349 | A1* | 9/2016 | Zhao | H01L 25/167 |
| 2018/0182838 | A1* | 6/2018 | Yeo | H10K 77/111 |
| 2019/0035329 | A1* | 1/2019 | Rappoport | G09G 3/30 |
| 2019/0088733 | A1* | 3/2019 | Cho | H10K 59/1315 |
| 2019/0140025 | A1 | 5/2019 | Wang | |
| 2019/0392767 | A1* | 12/2019 | Kim | G09G 3/3275 |
| 2020/0258969 | A1* | 8/2020 | Yi | G06F 3/0443 |
| 2021/0104582 | A1* | 4/2021 | Kim | G06F 1/1698 |
| 2021/0109617 | A1* | 4/2021 | Lin | H10K 59/38 |
| 2021/0134906 | A1* | 5/2021 | Lee | H10K 59/8792 |
| 2021/0191552 | A1* | 6/2021 | Bok | G06F 1/1643 |
| 2021/0193769 | A1* | 6/2021 | Bok | H01L 25/167 |
| 2021/0313538 | A1* | 10/2021 | Peng | H10K 50/818 |
| 2022/0005889 | A1* | 1/2022 | Jeong | H10K 59/65 |
| 2022/0157221 | A1* | 5/2022 | Kim | G09G 3/2092 |
| 2022/0165216 | A1* | 5/2022 | Hong | G09G 3/3233 |
| 2022/0181400 | A1* | 6/2022 | Choi | H10K 59/352 |
| 2022/0189410 | A1* | 6/2022 | Kim | H10K 59/131 |
| 2022/0208863 | A1* | 6/2022 | Cho | H10K 59/122 |
| 2022/0254853 | A1* | 8/2022 | Kim | H10K 59/352 |
| 2022/0344440 | A1* | 10/2022 | Lee | H10K 59/131 |
| 2022/0359625 | A1* | 11/2022 | Yang | H10K 59/122 |
| 2023/0020926 | A1* | 1/2023 | Park | H01L 33/62 |
| 2023/0108247 | A1* | 4/2023 | Choi | G06F 3/0446 345/174 |
| 2023/0157138 | A1* | 5/2023 | Gong | H10K 59/38 257/91 |
| 2023/0209925 | A1* | 6/2023 | Fan | G06F 3/0412 257/40 |

FOREIGN PATENT DOCUMENTS

| | | |
|---|---|---|
| KR | 10-2020-0075546 | 6/2020 |
| KR | 10-2020-0113090 | 10/2020 |
| KR | 10-2022-0006682 | 1/2022 |
| KR | 10-2022-0065953 | 5/2022 |
| KR | 10-2022-0113584 | 8/2022 |
| KR | 10-2023-0010082 | 1/2023 |

* cited by examiner

DISPLAY DEVICE

CROSS-REFERENCE TO RELATED APPLICATION(S)

This application claims priority to and benefits of Korean Patent Application No. 10-2021-0130778 under 35 U.S.C. § 119 filed on Oct. 1, 2021 in the Korean Intellectual Property Office, the entire contents of which are incorporated herein by reference.

BACKGROUND

1. Technical Field

This disclosure relates to a display device, and to a display device including light emitting elements.

2. Description of the Related Art

A display device may include a display area for displaying images and a peripheral area provided around the display area and displaying no images. Pixels are disposed in the display area, and combinations of the pixels may display images. Various elements such as transistors or capacitors and wires for supplying signals to the elements may be positioned in pixel areas corresponding to the respective pixels. Drivers including a gate driver, a data driver, a timing controller, for example, for generating signals applied to the pixels may be positioned in the peripheral area.

When the peripheral area of the display device is reduced, a screen-to-body ratio of the display device may be increased. The screen-to-body ratio reflects technical levels of the display device and may simultaneously function as an important factor when consumers select desired products. Fast driving (for example, a frame rate of more than 120 Hz) may be advantageous in increasing display quality (image quality), but a region occupied by the drivers is increased to achieve this purpose, thus it may be difficult to reduce the peripheral area.

The above information disclosed in this background section is only for enhancement of understanding of the background, and therefore it may contain information that does not form the prior art that may already be known to a person of ordinary skill in the art.

SUMMARY

Embodiments provide a display device for increasing a screen-to-body ratio.

Embodiments provide a display device in which a corner portion of a display area has a round shape or a substantially round shape.

A display device may include a display area including a first display area and a second display area adjacent to each other; a driving circuit, at least part of the driving circuit being disposed in the second display area; first pixel circuit units disposed in the first display area; first light emitting elements disposed in the first display area and electrically connected to the first pixel circuit units; second pixel circuit units disposed in the second display area; second light emitting elements disposed in the second display area and two or more of the second light emitting elements may be electrically connected to one of the second pixel circuit units; and a light blocking layer overlapping at least one of the second light emitting elements in a plan view.

The display area may include a corner portion, and the at least one second light emitting element may be disposed near an edge of the corner portion of the display area.

The at least one second light emitting element may include adjacent second light emitting elements in direction from the edge of the corner portion of the display area.

The light blocking layer may overlap the adjacent second light emitting elements in a plan view, the light blocking layer completely covering the adjacent second light emitting elements.

The at least one second light emitting element may include adjacent even-numbered second light emitting elements in the first direction from the edge of the corner portion of the display area.

The at least one second light emitting element may include at least one of the two or more second light emitting elements electrically connected to a same second pixel circuit unit.

The second light emitting elements may display a same color.

The at least one second light emitting element may overlap the driving circuit in a plan view.

The second light emitting elements may be disposed between a substrate and the light blocking layer.

The display device may further include a display unit including a substrate; the first light-emitting elements, and the second light emitting elements; and a touch unit disposed on the display unit, wherein the touch unit may include a touch conductive layer including the light blocking layer.

The touch unit may include a first insulating layer; a first touch conductive layer including a bridge disposed on the first insulating layer and electrically connecting touch electrodes; a second insulating layer disposed on the first touch conductive layer; and a second touch conductive layer disposed on the second insulating layer and including the touch electrodes and the light blocking layer.

The light blocking layer may be part of one of the touch electrodes or may be electrically connected to the one of the touch electrodes.

The touch unit may include a first insulating layer; a first touch conductive layer including a bridge disposed on the first insulating layer and electrically connecting touch electrodes and the light blocking layer; a second insulating layer disposed on the first touch conductive layer; and a second touch conductive layer disposed on the second insulating layer and including the touch electrodes.

The light blocking layer may be electrically connected to one of the touch electrodes.

The display device may further include a display unit including a substrate; the first light-emitting elements; and the second light emitting elements; and an anti-reflector disposed on the display unit, wherein the anti-reflector may include a light blocking member including the light blocking layer.

A display device may include a first display area and a second display area disposed outside of a display area; a driving circuit including a portion overlapping the second display area in a plan view; a first light emitting element disposed on the first display area; second light emitting elements disposed in the second display area and electrically connected to each other; and a light blocking layer overlapping at least one of the second light emitting elements in a plan view.

The second light emitting elements may overlap the driving circuit in a plan view.

The second display area may include a corner portion, and second light emitting elements may be near an edge of the corner portion of the second display area.

The display device may further include a touch conductive layer disposed on the first light emitting element and the second light emitting elements, wherein the touch conductive layer may include the light blocking layer.

The display device may further include a light blocking member disposed on the first light emitting element and the second light emitting elements, wherein the light blocking member may include the light blocking layer.

According to embodiments, the display device with the increased screen-to-body ratio may be provided. According to embodiments, the display device in which the corner portion of the display area has a smooth and round shape or a substantially round shape may be provided. According to embodiments, effects recognizable in the entire specification may be obtained.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
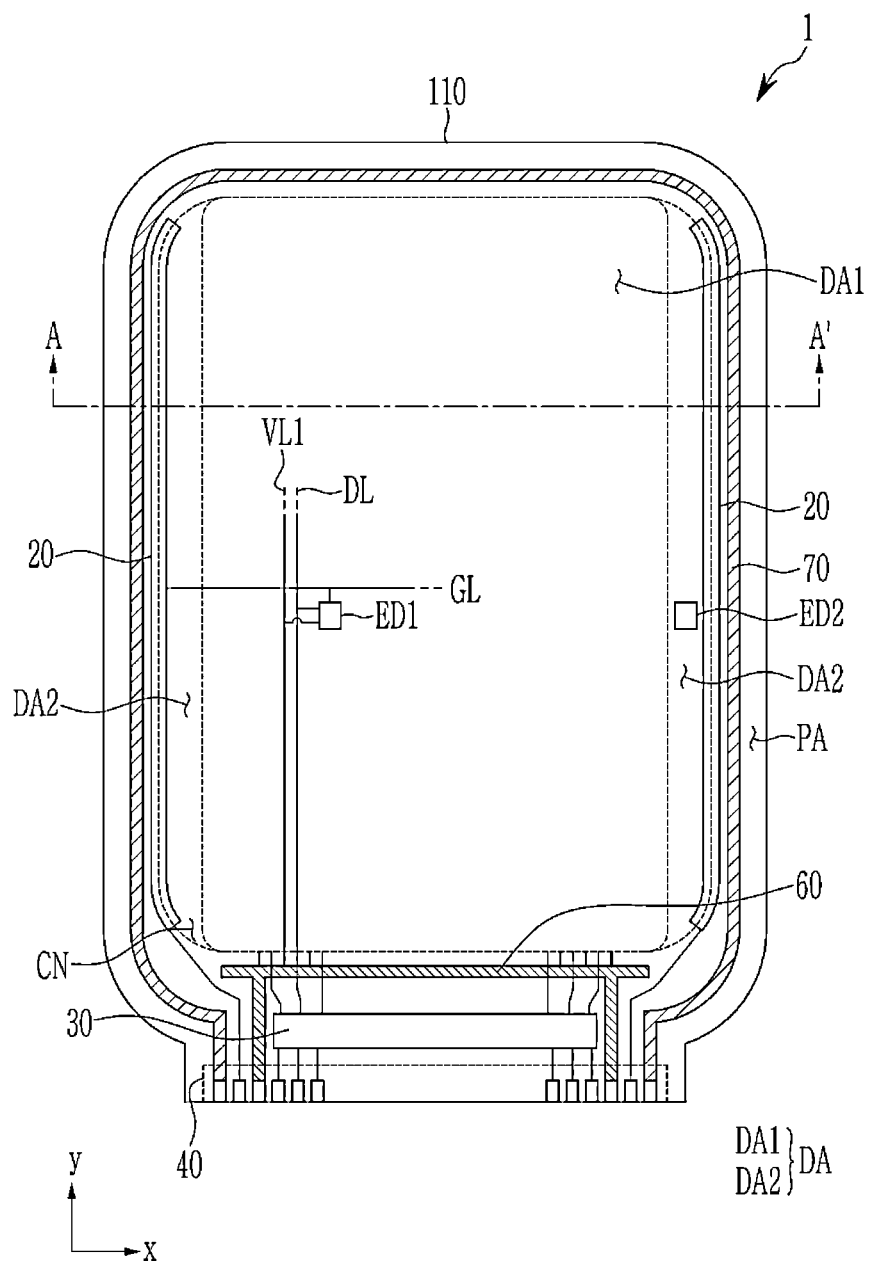
FIG. 1 shows a schematic top plan view of a display device according to an embodiment.

The disclosed embodiments will be described in detail with reference to the accompanying drawings. In the specification, the same or similar components will be denoted by the same or similar reference numerals, and an overlapping description thereof may be omitted.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

When it is described that a part is "connected" (or "coupled") to another part, the part may be "directly connected" to the other element, may be connected to the other part through a third part or another part, or may be connected to the other part physically or electrically, and they may be referred to by different titles depending on positions or functions, but respective portions that are substantially integrated into one body may be connected to each other.

Terms "x", "y", and "z" are used, and here, "x" is a first direction, "y" is a second direction that is perpendicular to the first direction, and "z" is a third direction that is perpendicular to the first direction and the second direction. The first direction x, the second direction y, and the third direction z may correspond to a horizontal direction, a vertical direction, and a thickness direction of the display device but are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
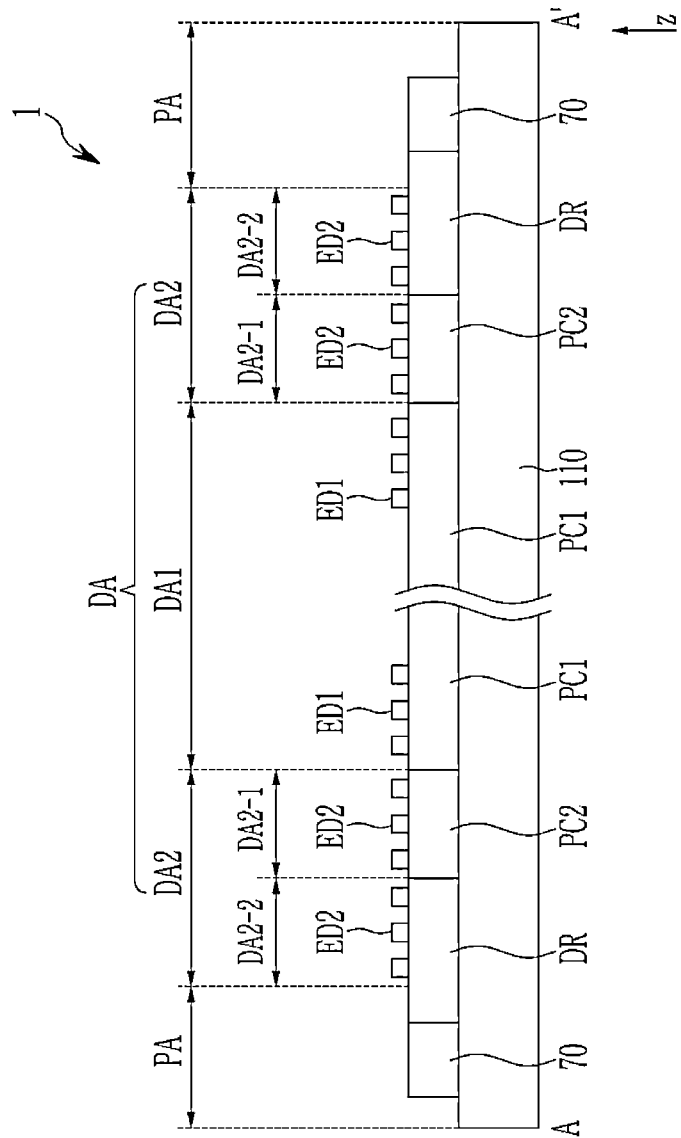
FIG. 2 shows a schematic cross-sectional view with respect to line A-A' according to an embodiment.

FIG. 1 shows a schematic top plan view of a display device according to an embodiment, and FIG. 2 shows a schematic cross-sectional view with respect to line A-A' according to an embodiment.

Referring to FIG. 1 and FIG. 2, the display device 1 may include a substrate 110 and light emitting elements ED1 and ED2 positioned on the substrate 110.

The substrate 110 may include a display area DA and a peripheral area PA. The display area DA and the peripheral area PA of the substrate 110 may correspond to a display area and a peripheral area of the display device 1.

The display area DA may correspond to a screen for displaying images. The display area DA may substantially have a quadrangular shape, and a corner portion CN may have a round shape. The display area DA may have various shapes.

The display area DA may include a first display area DA1 and a second display area DA2. The first display area DA1 may occupy most of the display area DA. The second display area DA2 may be disposed near the first display area DA1. The second display area DA2 may be positioned on respective sides of the first display area DA1. The second display area DA2 may be positioned on the corner portion CN of the display area DA. Differing from what is shown, the second display area DA2 may surround or may be adjacent to the first display area DA1.

The peripheral area PA may surround or may be adjacent to the display area DA. The peripheral area PA displays no images, and it may be positioned on an outside of the display device. Circuits and signal lines for generating and/or transmitting various signals applied to the display area DA may be disposed in the peripheral area PA.

The light emitting elements ED1 and ED2 may be positioned in the display area DA. Signal lines DL, GL, and VL1 may be electrically connected to the light emitting elements ED1 and ED2. The respective light emitting elements ED1 and ED2 may correspond to the pixels, and may display one of a first color, a second color, and a third color. For example, the respective light emitting elements ED1 and ED2 may output red, green, or blue light. The display area DA may provide images through a combination of the lights output by the light emitting elements ED1 and ED2.

The light emitting elements ED1 and ED2 may include first light emitting elements ED1 and second light emitting elements ED2. The first light emitting elements ED1 may be positioned in the first display area DA1, and the second light emitting elements ED2 may be positioned in the second display area DA2. The first light emitting elements ED1 may be disposed in a first direction x and a second direction y in the first display area DA1, and the second light emitting elements ED2 may be disposed in a first direction x and a second direction y in the second display area DA2. A size of the first light emitting element ED1 may be equal to or different from a size of the second light emitting element ED2. A comparison of the sizes between the first light emitting element ED1 and the second light emitting element ED2 is a comparison of the light emitting elements displaying a same color. The size of the light emitting element may signify an area of the light-emitting device, and the size and the area may be used in a mixed way. A number of the first light emitting element ED1 per area and a number of the second light emitting element ED2 per area may be equal to or different from each other. A resolution of the first display area DA1 and a resolution of the second display area DA2 may be equal to or different from each other. The disposal, the size, and the resolution of the first light emitting elements ED1 and the second light emitting elements ED2 are modifiable in many ways.

The display device 1 may further include pixel circuit units PC1 and PC2 positioned on the substrate 110. The pixel circuit units PC1 and PC2 may include first pixel circuit units PC1 and second pixel circuit units PC2. The first pixel circuit units PC1 may be positioned in the first display area DA1, and the second pixel circuit units PC2 may be positioned in the second display area DA2. The first pixel circuit units PC1 may be connected to the first light emitting elements ED1, and the second pixel circuit units PC2 may be connected to the second light emitting elements ED2. One first pixel circuit unit PC1 may be connected to at least one first light emitting element ED1, and one second pixel circuit unit PC2 may be connected to at least one second light emitting element ED2. For example, the first pixel circuit unit PC1 may be connected to one first light emitting element ED1, and one second pixel circuit unit PC2 may be connected to second light emitting elements ED2.

The area of one first pixel circuit unit PC1 and may be different from the area of one second pixel circuit unit PC2. For example, the first pixel circuit unit PC1 and the second pixel circuit unit PC2 may have a same length and may have different widths. The first pixel circuit unit PC1 and the second pixel circuit unit PC2 may have a same width and may have different lengths. The first pixel circuit unit PC1 and the second pixel circuit unit PC2 may have different lengths and widths. The area of the second pixel circuit unit PC2 may be greater than the area of the first pixel circuit unit PC1. For example, the area of the second pixel circuit unit PC2 may be twice the area of the first pixel circuit unit PC1.

A pad portion 40 may be positioned along an edge of the substrate 110 in the peripheral area PA. The pad portion 40 may include pads for receiving signals from the outside. A flexible printed circuit film (not shown) may be bonded to the pad portion 40, and the pads of the flexible printed circuit film may be electrically connected to the pads of the pad portion 40.

The display device 1 may include drivers for generating and/or processing various signals for driving the light emitting elements ED1 and ED2. The drivers may include a data driver for applying data voltages to the pixel circuit units PC1 and PC2 through data lines DL, a gate driver 20 for applying gate signals to the pixel circuit units PC1 and PC2 through gate lines GL, and a signal controller for controlling the data driver and the gate driver 20.

The gate driver 20 may include a driving circuit unit or driving circuit DR integrated on the substrate 110 and positioned on respective sides (or one side or a side) of the first display area DM. At least part of the driving circuit unit DR may be positioned in the second display area DA2. For example, part of the driving circuit unit DR may be positioned in the second display area DA2 and the other part thereof may be positioned in the peripheral area PA. The gate driver 20 may include a scan signal generator, an inverted scan signal generator, an initialization control line generator, a bypass control signal generator, and/or an emission control signal generator, and the respective generators may include some or a number of the driving circuit unit DR.

The data driver and the signal controller may be provided as an integrated circuit chip (also referred to as a driving IC chip) 30, and the integrated circuit chip 30 may be mounted in the peripheral area PA. The integrated circuit chip 30 may be mounted on the flexible printed circuit film and may be electrically connected to the pad portion 40.

The display device 1 may include a driving voltage supply line 60 and a common voltage supply line 70. The driving voltage supply line 60 may be positioned between the pad portion 40 and the display area DA in the peripheral area PA. The driving voltage supply line 60 may provide a driving voltage to the pixel circuit units PC1 and PC2 through the driving voltage lines VL1. The common voltage supply line 70 may be positioned in the peripheral area PA and may surround at least part of the display area DA. The common voltage supply line 70 may provide a common voltage to one electrode of the light emitting elements ED1 and ED2.

Disposal of the light emitting elements ED1 and ED2 and the pixel circuit units PC1 and PC2 will now be described in detail.

The first pixel circuit units PC1 and the first light emitting elements ED1 for receiving the driving currents from the first pixel circuit units PC1 are positioned in the first display area DA1. In other words, the region from which light is output by the first light emitting elements ED1 is the first display area DA1. The first light emitting element ED1 may be electrically connected thereto and may overlap the first pixel circuit unit PC1 for providing the driving current.

A combination of one first pixel circuit unit PC1 and one first light emitting element ED1 for receiving the driving current from the same will be referred to as a pixel of the first display area or a normal pixel. The first pixel circuit unit PC1 and the first light emitting element ED1 are also referred to as a normal pixel circuit unit and a normal light-emitting device.

The second light emitting elements ED2 for receiving the driving currents from the second pixel circuit units PC2 are positioned in the second display area DA2. In other words, the region in which light is output by the second light emitting elements ED2 is the second display area DA2. The second light emitting element ED2 may be electrically connected to the same and may or may not overlap the second pixel circuit unit PC2 for providing the driving current.

The second display area DA2 may be divided into a second-1 display area DA2-1 in which the second pixel circuit units PC2 are positioned and a second-2 display area DA2-2 in which the driving circuit unit DR is positioned. The second light emitting elements ED2 for receiving driving currents from the second pixel circuit units PC2 are positioned in the second-1 display area DA2-1 and the second-2 display area DA2-2. The second light emitting elements ED2 positioned in the second-1 display area DA2-1 and the second light emitting elements ED2 positioned in the second-2 display area DA2-2 may receive the driving currents from the second pixel circuit units PC2 positioned in the second-1 display area DA2-1. Therefore, the second pixel circuit units PC2 may include second pixel circuit units PC2 for transmitting driving currents to the second light emitting elements ED2 of the second-1 display area DA2-1 and second pixel circuit units PC2 for transmitting driving currents to the second light emitting elements ED2 of the second-2 display area DA2-2.

Hereinafter, a combination of one second pixel circuit unit PC2 and one second light emitting element ED2 for receiving a driving current from the second pixel circuit unit PC2 will be referred to as a pixel of a second display area or a modified pixel. The second pixel circuit unit PC2 and the second light emitting element ED2 are also respectively referred to as a modified pixel circuit unit and a modified light-emitting device. The second light emitting element ED2 positioned in the second-1 display area DA2-1 is referred to as a second-1 light emitting element or an intermediate light-emitting device, and the second light emitting element ED2 positioned in the second-2 display area DA2-2 is referred to as a second-2 light emitting element or a driver light-emitting device.

Regarding the display device, the light emitting elements are positioned on the pixel circuit units, and no light emitting elements are positioned on the driver such as the gate driver. Some or a number of the second light emitting elements ED2 are disposed in the region overlapping the driving circuit unit DR, thereby expanding the display area DA and increasing the screen-to-body ratio. The second light emitting elements ED2 may overlap other circuit units or signal lines in addition to the driving circuit unit DR.

Figure 3:
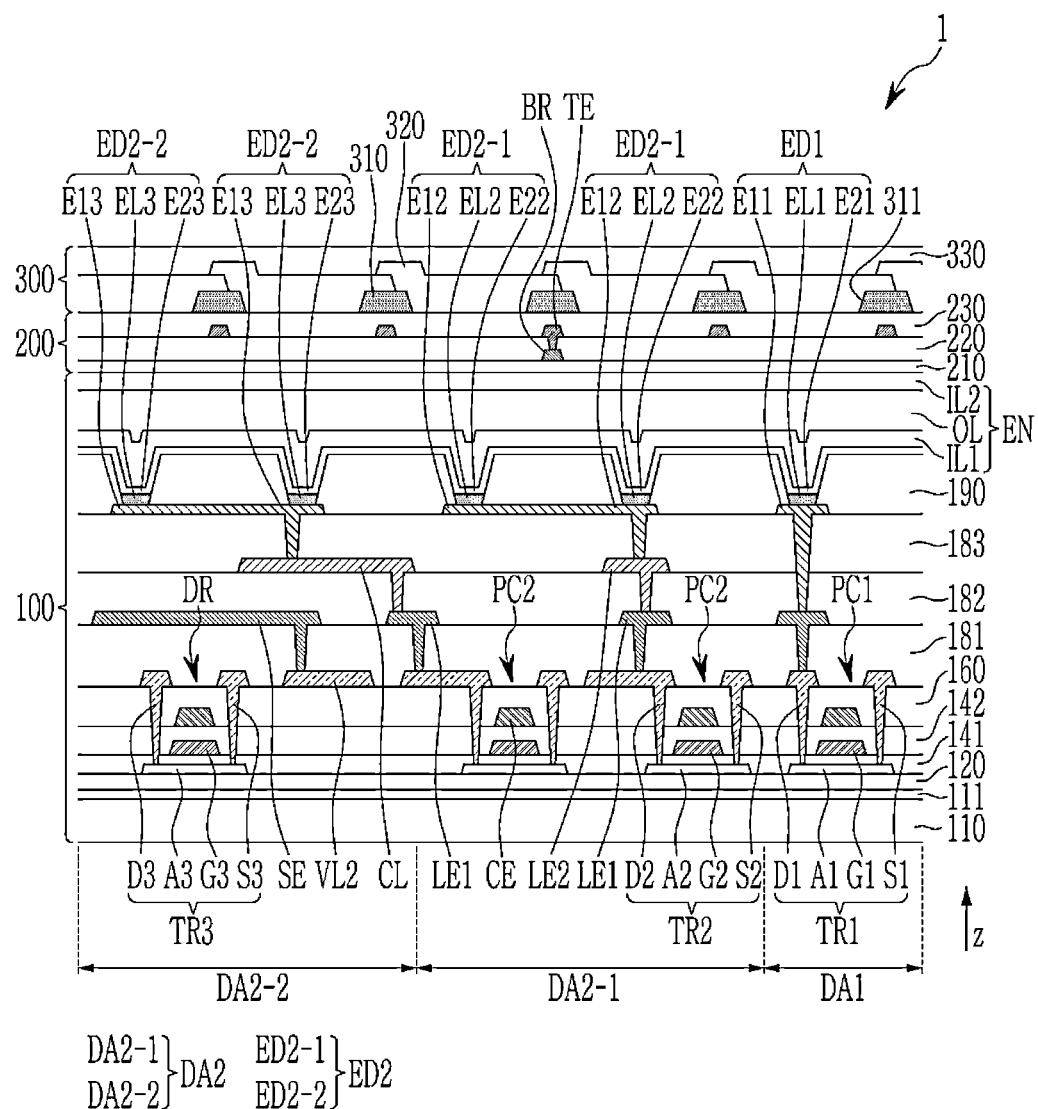
FIG. 3 shows a schematic cross-sectional view of a display device according to an embodiment.

FIG. 3 shows a schematic cross-sectional view of a display device according to an embodiment.

Referring to FIG. 3, the display device 1 may include a substrate 110, transistors TR1, TR2, and TR3 disposed on the substrate, and light emitting elements ED1 and ED2 connected to the transistors TR1 and TR2. The transistors TR1, TR2, and TR3 may include a first transistor TR1 included by the first pixel circuit unit PC1, a second transistor TR2 included by the second pixel circuit unit PC2, and a third transistor TR3 included by the driving circuit unit DR.

The substrate 110 may be a flexible substrate including polymers such as a polyimide, a polyamide, or a polyethylene terephthalate. The substrate 110 may be a glass substrate.

A barrier layer 111 for preventing permeation of moisture or oxygen may be positioned on the substrate 110. The barrier layer 111 may include an inorganic insulating material such as a silicon nitride (SiNx), a silicon oxide (SiOx), or a silicon oxynitride (SiOxNy), and may be a single layer or a multilayer.

A buffer layer 120 may be positioned on the barrier layer 111. The buffer layer 120 may improve a characteristic of a semiconductor layer by blocking an impurity from the substrate 110 when the semiconductor layer is formed, and may reduce a stress of the semiconductor layer by flattening a surface of the substrate 110. The buffer layer 120 may include an inorganic insulating material such as a silicon oxide, a silicon nitride, or a silicon oxynitride. The buffer layer 120 may include amorphous silicon.

Semiconductor layers A1, A2, and A3 of the transistors TR1, TR2, and TR3 may be positioned on the buffer layer 120. The respective semiconductor layers A1, A2, and A3 may include a first region, a second region, and a channel region between the first and second regions. The semiconductor layers A1 and A2 may include a semiconductor material such as polysilicon or an oxide semiconductor.

A first gate insulating layer 141 may be positioned on the semiconductor layers A1, A2, and A3. The first gate insulating layer 141 may include an inorganic insulating material such as a silicon nitride (SiNx), a silicon oxide (SiOx), or a silicon oxynitride (SiOxNy), and may be a single layer or a multilayer.

A first gate conductive layer including gate electrodes G1, G2, and G3 of the transistors TR1, TR2, and TR3 may be positioned on the first gate insulating layer 141. The first gate conductive layer may be made of a same material or a similar material in a same process. The first gate conductive layer may include molybdenum (Mo), aluminum (Al), copper (Cu), and titanium (Ti), and may be a single layer or a multilayer.

A second gate insulating layer 142 may be positioned on the first gate conductive layer. The second gate insulating layer 142 may include an inorganic insulating material such as a silicon nitride, a silicon oxide, or a silicon oxynitride, and may be a single layer or a multilayer.

A second gate conductive layer including an upper electrode CE of a storage capacitor may be positioned on the second gate insulating layer 142. The upper electrode CE may overlap the gate electrodes G1, G2, and G3, and an upper electrode CE, the gate electrodes G1, G2, and G3, and the second gate insulating layer 142 provided or disposed therebetween may form the storage capacitor. The second gate conductive layer may be made of a same material or similar material in a same process. The second gate conductive layer may include molybdenum (Mo), aluminum (Al), copper (Cu), and titanium (Ti), and may be a single layer or a multilayer.

An inter-layer insulating layer 160 may be positioned on the second gate conductive layer. The inter-layer insulating layer 160 may include an inorganic insulating material such as a silicon nitride, a silicon oxide, or a silicon oxynitride, and may be a single layer or a multilayer.

A first data conductive layer including first electrodes S1, S2, and S3 and second electrodes D1, D2, and D3 of the transistors TR1, TR2, and TR3 and an initialization voltage line VL2 may be positioned on the inter-layer insulating layer 160. The first electrodes S1, S2, and S3 and the second electrodes D1, D2, and D3 may be connected to first regions and second regions of the semiconductor layers A1, A2, and A3 through contact holes formed in the insulating layers 141, 142, and 160. One of the first electrodes S1, S2, and S3 and the second electrodes D1, D2, and D3 may be source electrodes, and the other one may be drain electrodes. The first data conductive layer may be made of a same material or a similar material in a same process. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or a multilayer. For example, the first data conductive layer may include a lower layer including a refractory metal such as molybdenum, chromium, tantalum, or titanium, an intermediate layer including a low-resistivity metal such as aluminum, copper, or silver, and an upper layer such as a refractory metal. For example, the first data conductive layer may have a triple-layered structure such as titanium/aluminum/titanium (Ti/Al/Ti).

A first planarization layer 181 may be positioned on the first data conductive layer. The first planarization layer 181 may be an organic insulating layer. For example, the first planarization layer 181 may include an organic insulating material such as a general purpose polymer such as polymethyl methacrylate or polystyrene, a polymer derivative having a phenol-based group, an acryl-based polymer, an imide-based polymer, a polyimide, and a siloxane-based polymer.

A second data conductive layer including a first connection electrode LE1 and a shield electrode SE may be positioned on the first planarization layer 181. The first connection electrode LE1 may be connected to the second electrodes D1 and D2 of the transistors TR1 and TR2 through a contact hole formed in the first planarization layer 181. The shield electrode SE may be connected to the initialization voltage line VL2 through the contact hole in the first planarization layer 181, and may receive the initialization voltage. The shield electrode SE may be positioned between the driving circuit unit DR and the second-2 light emitting element ED2-2. The second-2 light emitting element ED2-2 may overlap the driving circuit unit DR, and may be influenced by a voltage applied to the driving circuit unit DR. The influence of the driving circuit unit DR given to the second-2 light emitting element ED2-2 may be shielded by the shield electrode SE to which a constant voltage such as the initialization voltage is applied. The shield electrode SE may be connected to the voltage line for applying the constant voltage in addition to the initialization voltage line VL2. The second data conductive layer may be made of a same material or a similar material in a same process. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or a multilayer. For example, the second data conductive layer may have a triple-layered structure such as titanium/aluminum/titanium (Ti/Al/Ti).

A second planarization layer 182 may be positioned on the second data conductive layer. The second planarization layer 182 may be an organic insulating layer. For example, the second planarization layer 182 may include an organic insulating material such as a general purpose polymer such as polymethyl methacrylate or polystyrene, a polymer derivative having a phenol-based group, an acryl-based polymer, an imide-based polymer, a polyimide, and a siloxane-based polymer.

A third data conductive layer including a second connection electrode LE2 and a connection line CL may be positioned on the second planarization layer 182. The connection line CL may extend to the second-2 display area DA2-2 from the second-1 display area DA2-1. The second connection electrode LE2 and the connection line CL may be connected to the different first connection electrodes LE1 through a contact hole formed in the second planarization layer 182. The second data conductive layer may be made of a same material or a similar material in a same process. The third data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or a multilayer. For example, the third data conductive layer may have a triple-layered structure such as titanium/aluminum/titanium (Ti/Al/Ti). The third data conductive layer may include a transparent conductive oxide (TCO) such as an indium tin oxide (ITO) or an indium zinc oxide (IZO).

A third planarization layer 183 may be positioned on the third data conductive layer. The third planarization layer 183 may be an organic insulating layer. For example, the third planarization layer 183 may include an organic insulating material such as a general purpose polymer such as polymethyl methacrylate or polystyrene, a polymer derivative having a phenol-based group, an acryl-based polymer, an imide-based polymer, a polyimide, and a siloxane-based polymer.

A pixel conductive layer including pixel electrodes E11, E12, and E13 may be positioned on the third planarization layer 183. The pixel electrode E11 may be connected to the first connection electrode LE1 through the contact holes formed in the second and third planarization layers 182 and 183. The pixel electrode E12 may be connected to the second connection electrode LE2 through the contact hole formed in the third planarization layer 183. The pixel electrode E13 positioned in the second-2 display area DA2-2 may be connected to the connection line CL through the contact hole formed in the third planarization layer 183. The pixel electrode E13 positioned in the second-2 display area DA2-2 may be electrically connected to the second transistor TR2 positioned in the second-1 display area DA2-1 by the connection line CL. Differing from what is shown, the display device 1 may not include the connection line CL, and an extension of the pixel electrode E13 may reach the second-1 display area DA2-1 and may be connected to the first connection electrode LE1 connected to the second transistor TE or the second electrode D2 of the second transistor TR2.

The pixel electrodes E11, E12, and E13 may be electrically connected to the second electrodes D1 and D2 and may receive driving currents for controlling luminance of the light emitting elements ED1 and ED2. Differing from what is shown, the pixel electrode E11 may be connected to the first connection electrode LE1 through the second connection electrode LE2 overlapping the first connection electrode LE1, and the pixel electrode E12 may be connected to the first connection electrode LE1. The pixel conductive layer may be made of a same material or a similar material in a same process. The pixel conductive layer may include a metal such as silver (Ag), lithium (Li), calcium (Ca), aluminum (Al), magnesium (Mg), or gold (Au). The pixel conductive layer may include a transparent conductive oxide (TCO) such as an indium tin oxide (ITO) or an indium zinc oxide (IZO).

A pixel defining layer 190 may be positioned on the pixel conductive layer. The pixel defining layer 190 may have an opening overlapping the pixel electrodes E11, E12, and E13. The pixel defining layer 190 may include an organic insulating material such as a general purpose polymer such as polymethyl methacrylate or polystyrene, a polymer derivative having a phenol-based group, an acryl-based polymer, an imide-based polymer, a polyimide, and a siloxane-based polymer. The pixel defining layer 190 may be a black pixel defining layer 190 including a black dye or pigment. The black pixel defining layer 190 may increase a contrast ratio, and may prevent a reflection by a metal layer positioned below.

Emission layers EL1, EL2, and EL3 may be positioned on the pixel electrodes E11, E12, and E13. At least part of the emission layers EL1, EL2, and EL3 may be positioned in the opening of the defining layer 190. The emission layers EL1, EL2, and EL3 may include material layers for uniquely emitting light of primary colors such as red, green, and blue. The emission layers EL1, EL2, and EL3 may have a structure in which material layers emitting light of different colors may be stacked each other. At least one of a hole injection layer, a hole transfer layer, an electron transfer layer, and an electron injection layer in addition to the emission layers EL1, EL2, and EL3 may be positioned on the pixel electrodes E11, E12, and E13.

Common electrodes E21, E22, and E23 may be positioned on the emission layers EL1, EL2, and EL3 and the pixel defining layer 190. The common electrodes E21, E22, and E23 may be provided to the entire pixels, and may be sequentially formed. The common electrodes E21, E22, and E23 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrodes E21, E22, and E23 may include a transparent conductive oxide (TCO) such as an indium tin oxide (ITO) or an indium zinc oxide (IZO).

The pixel electrodes E11, E12, and E13, the emission layers EL1, EL2, and EL3, and the common electrodes E21, E22, and E23 may form the light emitting elements ED1 and ED2 such as the light emitting diode (LED) or the organic light emitting diode. The pixel electrodes E11, E12, and E13 may be an anode of the light emitting diode (LED), and the common electrodes E21, E22, and E23 may be a cathode of the light emitting diode (LED).

The region overlapped by the pixel electrodes E11, E12, and E13, the emission layers EL1, EL2, and EL3, and the common electrodes E21, E22, and E23 may be a light emitting region in which the light emitting elements ED1 and ED2 emit light. The light emitting region of the light emitting elements ED1 and ED2 may correspond to the pixel. The light emitting region of the first light emitting element ED1 may overlap the first pixel circuit unit PC1 connected to the light emitting region. The light emitting region of the second-1 light emitting element ED2-1 may overlap the second pixel circuit unit PC2 connected to the light emitting region, or may overlap the second pixel circuit unit PC2 connected to the second-2 light emitting element ED2-2. The light emitting region of the second-2 light emitting element ED2-2 may not overlap the second pixel circuit unit PC2 connected to the light emitting region, and may overlap the driving circuit unit DR. The overlapping of the light emitting element may signify the overlapping the light emitting region of the light-emitting device.

One first light emitting element ED1 may be connected to one first pixel circuit unit PC1. Second light emitting elements ED2 may be connected to one second pixel circuit unit PC2. Two second-1 light emitting elements ED2-1 may be connected to one second pixel circuit unit PC2, or two second-2 light emitting elements ED2-2 may be connected to the same. Second light emitting elements ED2 connected to one second pixel circuit unit PC2 may display a same color. For example, the two second-1 light emitting elements ED2-1 connected to the second transistor TR2 may display one color of red, green, and blue, and the two second-2 light emitting elements ED2-2 connected to the second transistor TR2 may display one color of red, green, and blue.

An encapsulation layer EN may be positioned on the common electrodes E21, E22, and E23. The encapsulation layer EN may encapsulate the light emitting elements ED1 and ED2 to prevent moisture and oxygen from permeating from the outside. The encapsulation layer EN may be a thin film encapsulation layer including at least one inorganic layer and at least one organic layer. For example, the encapsulation layer EN may have a triple-layered structure of a first inorganic layer ILL an organic layer OL, and a second inorganic layer IL2.

A touch unit 200 may be positioned on the encapsulation layer EN.

The touch unit 200 may include a first insulating layer 210 positioned on the encapsulation layer EN. The first insulating layer 210 may cover or overlap the encapsulation layer EN to protect the encapsulation layer EN and prevent permeation of moisture. The first insulating layer 210 may reduce parasitic capacitance between the common electrodes E21, E22, and E23 and the touch electrode TE.

A first touch conductive layer including a bridge BR may be positioned on the first insulating layer 210. A second insulating layer 220 may be positioned on the first touch conductive layer. A second touch conductive layer including touch electrodes TE may be positioned on the second insulating layer 220. A passivation layer 230 may be positioned on the second touch conductive layer.

The touch electrodes TE may include first touch electrodes and second touch electrodes forming mutual sensing capacitors. The bridge BR may electrically connect the first touch electrodes or second touch electrodes. For example, the first touch electrodes that are near each other and separated from each other may be connected to the bridge BR through contact holes formed in the second insulating layer 220, and may be electrically connected through the bridge BR.

The first insulating layer 210 and the second insulating layer 220 may include an inorganic insulating material such as a silicon nitride, a silicon oxide, or a silicon oxynitride, and may be a single layer or a multilayer. The passivation layer 230 may be made of an organic insulating material such as an acryl-based polymer or a polyimide-based resin, or may be made of an inorganic insulating material such as a silicon nitride, a silicon oxide, or a silicon oxynitride.

The first touch conductive layer and the second touch conductive layer may have a mesh shape including openings overlapping the light emitting regions of the light emitting elements ED1 and ED2. The first touch conductive layer may be made of a same material or a similar material in a same process. The second touch conductive layer may be made of a same material or a similar material in a same process. The first touch conductive layer and the second touch conductive layer may include a metal such as aluminum (Al), copper (Cu), titanium (Ti), molybdenum (Mo), silver (Ag), chromium (Cr), or nickel (Ni), and may be a single layer or a multilayer. For example, the first touch conductive layer and/or the touch conductive layer may have a triple-layered structure such as titanium/aluminum/titanium (Ti/Al/Ti).

An anti-reflector 300 may be positioned on the touch unit 200.

The anti-reflector 300 may include a light blocking member 310 and a color filter 320.

The light blocking member 310 may overlap the pixel defining layer 190 of the display unit 100, and may be narrower than the pixel defining layer 190. The light blocking member 310 may have openings 311 overlapping the openings of the pixel defining layer 190. The light blocking member 310 may be referred to as a black matrix.

The color filter 320 may be positioned on the light blocking member 310. The color filter 320 may include a red color filter, a green color filter, and a blue color filter. Most of the color filter 320 may overlap the openings 311 of the light blocking member 310. An overcoat layer 330 may be positioned on the color filter 320.

The anti-reflector 300 may prevent external light that is input from the outside from being reflected by wires and being visible. A combination of the light blocking member 310 and the color filter 320 may function as an anti-reflection layer. The above-described configuration may not need a polarization layer as the anti-reflection layer, thereby increasing light outputting efficiency and reducing a thickness of the display device 1. The anti-reflector 300 may include a polarization layer instead of the combination of the light blocking member 310 and the color filter 320. For example, the polarization layer may be attached to the touch unit 200 by an adhesive member such as an optically clear adhesive (OCA).

The first light emitting elements ED1 positioned in the first display area DA1 and the second light emitting elements ED2 positioned in the second display area DA2 may be disposed in many ways. Disposal of the first pixel circuit units PC1 and the first light emitting elements ED1, disposal of the second pixel circuit units PC2 and the second light emitting elements ED2, and a connection of the second light emitting elements ED2 will now be described.

Figure 4:
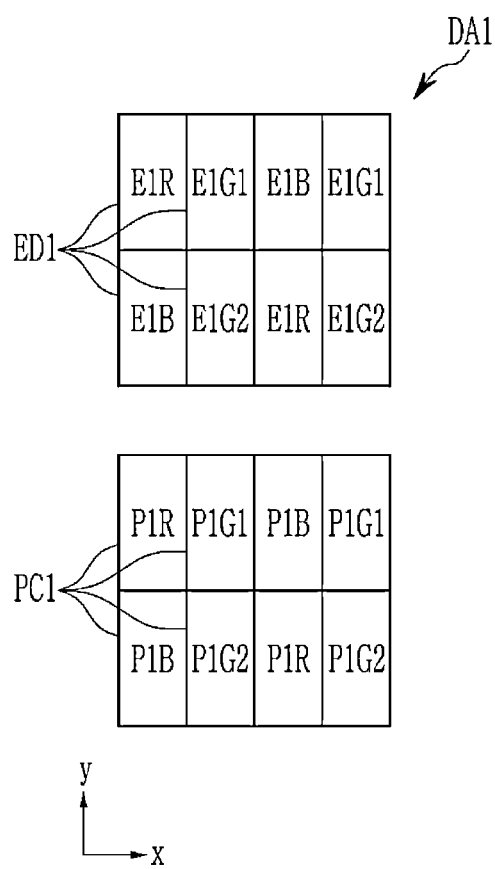
FIG. 4 shows a disposal of a first pixel circuit unit and a disposal of a first light emitting element of a display device according to an embodiment.

FIG. 4 shows a disposal of a first pixel circuit unit and a disposal of a first light emitting element of a display device according to an embodiment.

The first pixel circuit units PC1 and the first light emitting elements ED1 have been described to be separated from each other for the purpose of description in FIG. 4, but the first light emitting elements ED1 may overlap the first pixel circuit units PC1.

Referring to FIG. 4, the first light emitting elements ED1 may be disposed in a first direction x and a second direction y in the first display area DA1. The first direction x may be a row direction, and the second direction y may be a column direction. The first pixel circuit units PC1 may be disposed in the first direction x and the second direction y in the first display area DM. The first pixel circuit units PC1 disposed in the first direction x may be connected to a same gate line GL, and the first pixel circuit units PC1 disposed in the second direction y may be connected to a same data line DL.

The first light emitting elements ED1 may include a first sub-light emitting element E1R, a second sub-light emitting element E1B, a third sub-light emitting element E1G1, and a fourth sub-light emitting element E1G2. The first sub-light emitting element E1R, the second sub-light emitting element E1B, the third sub-light emitting element E1G1, and the fourth sub-light emitting element E1G2 may respectively emit light of a color. For example, the first sub-light emitting element E1R may emit red light, and the second sub-light emitting element E1B may emit blue light. The third sub-light emitting element E1G1 and the fourth sub-light emitting element E1G2 may emit green light. The first sub-light emitting element E1R and the third sub-light emitting element E1G1 may be adjacent in the first direction x, and the second sub-light emitting element E1B and the fourth sub-light emitting element E1G2 may be adjacent in the first direction x. The first sub-light emitting element E1R and the second sub-light emitting element E1B may be adjacent in the second direction y, and the third sub-light emitting element E1G1 and the fourth sub-light emitting element E1G2 may be adjacent in the second direction y.

The first pixel circuit unit PC1 may include a first sub-pixel circuit unit P1R, a second sub-pixel circuit unit P1B, a third sub-pixel circuit unit P1G1, and a fourth sub-pixel circuit unit P1G2. The first sub-pixel circuit unit P1R may be connected to the first sub-light emitting element E1R, and the first sub-light emitting element E1R may overlap the first sub-pixel circuit unit P1R. The second sub-pixel circuit unit P1B may be connected to the second sub-light emitting element E1B, and the second sub-light emitting element E1B may overlap the second sub-pixel circuit unit P1B. The third sub-pixel circuit unit P1G1 may be connected to the third sub-light emitting element E1G1, and the third sub-light emitting element E1G1 may overlap the third sub-pixel circuit unit P1G1. The fourth sub-pixel circuit unit P1G2 may be connected to the fourth sub-light emitting element E1G2, and the fourth sub-light emitting element E1G2 may overlap the fourth sub-pixel circuit unit P1G2. For example, the first light emitting element ED1 may overlap the first pixel circuit unit PC1 connected to the first light emitting element ED1. The first sub-pixel circuit unit P1R and the third sub-pixel circuit unit P1G1 may be adjacent in the first direction x, and the second sub-pixel circuit unit P1B and the fourth sub-pixel circuit unit P1G2 may be adjacent in the first direction x. The first sub-pixel circuit unit P1R and the second sub-pixel circuit unit P1B may be adjacent in the second direction y, and the third sub-pixel circuit unit P1G1 and the fourth sub-pixel circuit unit P1G2 may be adjacent in the second direction y.

The four sub-pixel circuit units P1R, P1B, P1G1, and P1G2 and the four sub-light emitting elements E1R, E1B, E1G1, and E1G2 may form one pixel group. Pixel groups may be repeatedly disposed in the first direction x and the second direction y in the first display area DA1.

Figure 5:
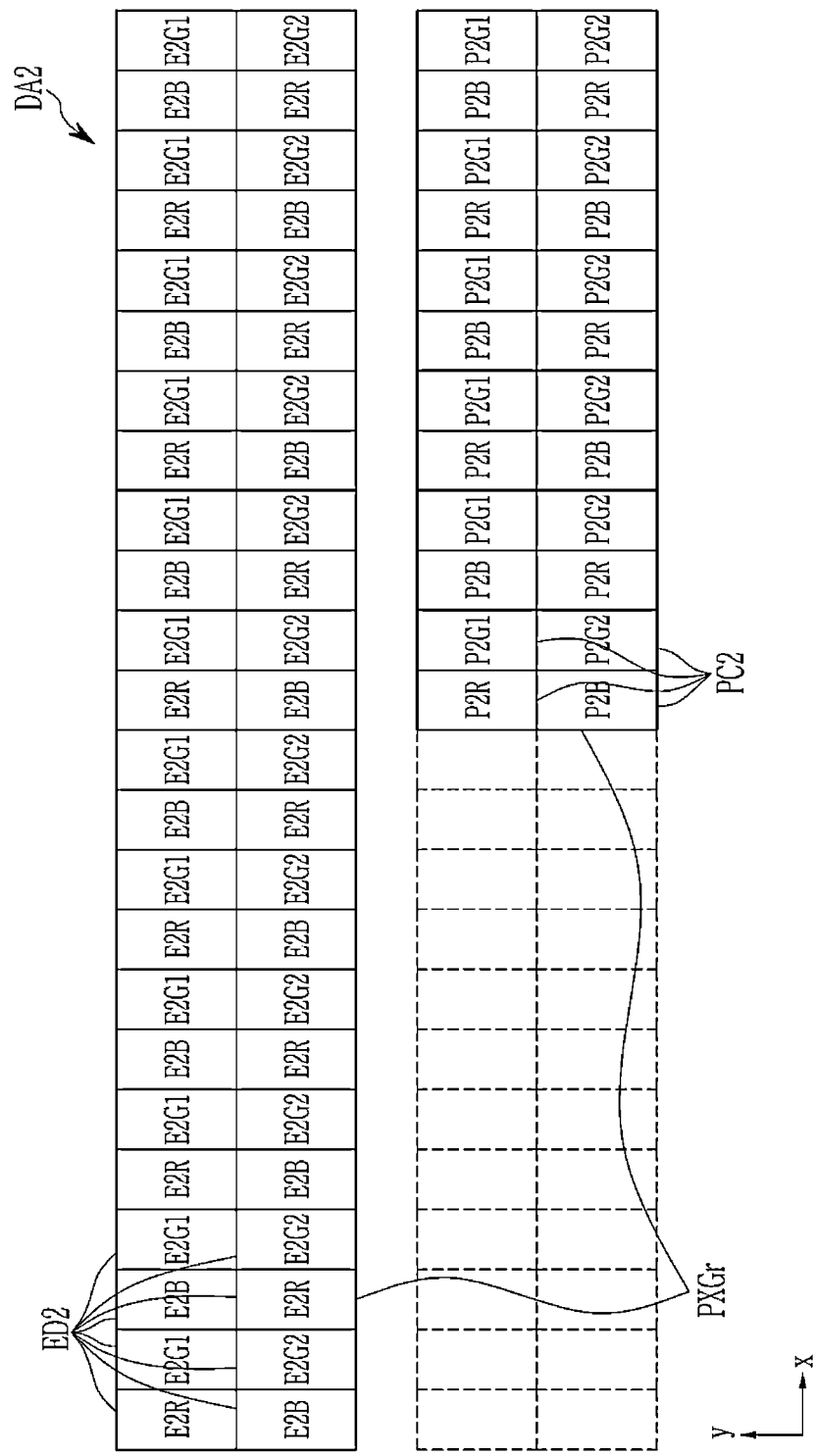
FIG. 5 shows a disposal of a second pixel circuit unit and a disposal of a second light emitting element of a display device according to an embodiment.
Figure 6:
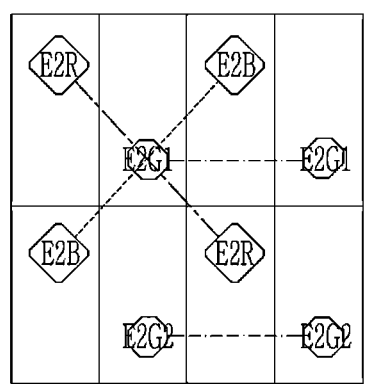
FIG. 6 shows a schematic top plan view of connection of second light emitting elements of a display device according to an embodiment.

FIG. 5 shows a disposal of a second pixel circuit unit and a disposal of a second light emitting element of a display device according to an embodiment, and FIG. 6 shows a schematic top plan view of connection of second light emitting elements of a display device according to an embodiment.

The second pixel circuit units PC2 and the second light emitting elements ED2 have been described to be separated from each other for the purpose of description in FIG. 5, and the second light emitting elements ED2 may overlap the second pixel circuit units PC2.

Referring to FIG. 5 and FIG. 6, a disposal form of the second pixel circuit unit PC2 and the second light emitting element ED2 and a connection form of the second light emitting element ED2 when the respective second pixel circuit units PC2 are connected to two second light emitting elements ED2 are disclosed as an example.

The second light emitting elements ED2 may be disposed in the first direction x and the second direction y in the second display area DA2. The second pixel circuit units PC2 may be disposed in the first direction x and the second direction y in the second display area DA2. The second pixel circuit units PC2 disposed in the first direction x may be connected to a same gate line GL, and the second pixel circuit units PC2 disposed in the second direction y may be connected to a same data line DL.

The second light emitting element ED2 may include a first sub-light emitting element E2R, a second sub-light emitting element E2B, a third sub-light emitting element E2G1, and a fourth sub-light emitting element E2G2. The first sub-light emitting element E2R, the second sub-light emitting element E2B, the third sub-light emitting element E2G1, and the fourth sub-light emitting element E2G2 may emit light of a color. For example, the first sub-light emitting element E2R may emit red light, and the second sub-light emitting element E2B may emit blue light. The third sub-light emitting element E2G1 and the fourth sub-light emitting element E2G2 may emit green light. The first sub-light emitting element E2R, the second sub-light emitting element E2B, the third sub-light emitting element E2G1, and the fourth sub-light emitting element E2G2 may substantially have the same light emitting region size as the first sub-light emitting element E1R, the second sub-light emitting element E1B, the third sub-light emitting element E1G1, and the fourth sub-light emitting element E1G2. In other words, the size of the light emitting region of the first light emitting element ED1 positioned in the first display area DA1 may substantially correspond to the size of the light emitting region of the second light emitting element ED2 positioned in the second display area DA2 and displaying a same color.

In a first row, the first sub-light emitting element E2R, the third sub-light emitting element E2G1, the second sub-light emitting element E2B, and the third sub-light emitting element E2G1 may be sequentially disposed in the first direction x. In a second row, the second sub-light emitting element E2B, the fourth sub-light emitting element E2G2, the first sub-light emitting element E2R, and the fourth sub-light emitting element E2G2 may be sequentially disposed in the first direction x. The first sub-light emitting element E2R and the second sub-light emitting element E2B may be adjacent in the second direction y, and the third sub-light emitting element E2G1 and the fourth sub-light emitting element E2G2 may be adjacent in the second direction y.

The second pixel circuit unit PC2 may include a first sub-pixel circuit unit P2R, a second sub-pixel circuit unit P2B, a third sub-pixel circuit unit P2G1, and a fourth sub-pixel circuit unit P2G2. The first sub-pixel circuit unit P2R may be connected to two first sub-light emitting elements E2R. The second sub-pixel circuit unit P2B may be connected to two second sub-light emitting elements E2B. The third sub-pixel circuit unit P2G1 may be connected to two third sub-light emitting elements E2G1. The fourth sub-pixel circuit unit P2G2 may be connected to two fourth sub-light emitting elements E2G2. The second light emitting element ED2 (for example, the second-1 light emitting element ED2-1 positioned in the second-1 display area DA2-1) may overlap the second pixel circuit unit PC2 that is not connected to the second light emitting element ED2. The second light emitting element ED2 (for example, the second-2 light emitting element ED2-2 positioned in the second-2 display area DA2-2) may not overlap the second pixel circuit unit PC2 that is connected to two second light emitting element ED2. The first sub-pixel circuit unit P2R and the third sub-pixel circuit unit P2G1 may be adjacent in the first direction x, and the second sub-pixel circuit unit P2B and the fourth sub-pixel circuit unit P2G2 may be adjacent in the first direction x. The first sub-pixel circuit unit P2R and the second sub-pixel circuit unit P2B may be adjacent in the second direction y, and the third sub-pixel circuit unit P2G1 and the fourth sub-pixel circuit unit P2G2 may be adjacent in the second direction y.

The two first sub-light emitting elements E2R connected to the first sub-pixel circuit unit P2R may be disposed in a fourth direction x' between the first direction x and the second direction y. For example, the two first sub-light emitting elements E2R that are adjacent in the fourth direction x' may be connected to each other and may receive the same signal (driving current), and may display the same luminance. The two second sub-light emitting elements E2B connected to the second sub-pixel circuit unit P2B may be disposed in a fifth direction y' traversing the fourth direction x'. For example, the two second sub-light emitting elements E2B that are adjacent in the fifth direction y' may be connected to each other to receive the same signal (or a driving current), and may indicate the same luminance. The two third sub-light emitting elements E2G1 connected to the third sub-pixel circuit unit P2G1 may be disposed in the first direction x. For example, the two third sub-light emitting elements E2G1 that are adjacent in the first direction x may be connected to each other to receive the same signal (or a driving current), and may indicate the same luminance. The two fourth sub-light emitting elements E2G2 connected to the fourth sub-pixel circuit unit P2G2 may be disposed in the first direction x. For example, the two fourth sub-light emitting elements E2G2 that are adjacent in the first direction x may be connected to each other to receive the same signal (or a driving current), and may indicate the same luminance.

Disposal of the sub-light emitting elements E2R, E2B, E2G1, and E2G2 are modifiable in many ways. For example, the two third sub-light emitting elements E2G1 may be disposed in the second direction y or the fourth direction x', and the two fourth sub-light emitting elements E2G2 may be disposed in the second direction y or the fifth direction y'. The two sub-light emitting elements E2R, E2B, E2G1, and E2G2 that are adjacent are shown to be connected, and two or more than that may be connected. For example, the two third sub-light emitting elements E2G1 and the two fourth sub-light emitting elements E2G2 may all be connected to one second pixel circuit unit PC2 and may receive the same signal (or a driving current).

One of the two second light emitting elements ED2 that are connected to each other and display a same color and luminance may be referred to as a copy light-emitting device. When the copy light emitting element is formed as described above, the light emitting region of the second light emitting element ED2 may substantially have the same size as the light emitting region of the first light emitting element ED1 so the resolution and/or luminance of the second display area DA2 may be prevented from being deteriorated compared to that of the first display area DA1.

Four sub-pixel circuit units P2R, P2B, P2G1, and P2G2 and eight sub-light emitting elements E2R, E2B, E2G1, and E2G2 may form one pixel group PXGr. Pixel groups PXGr may be repeatedly disposed in the first direction x and the second direction y in the second display area DA2. The second pixel circuit units PC2 of the first, second, and third pixel groups PXGr from the left may be connected to the second light emitting elements ED2 (for example, the second-2 light emitting elements ED2-2) of the first, second, and third pixel groups PXGr from the left. The second pixel circuit units PC2 of the fourth, fifth, and sixth pixel groups PXGr from the left may be connected to the second light emitting elements ED2 (for example, the second-1 light emitting elements ED2-1) of the fourth, fifth, and sixth pixel groups PXGr. The second light emitting elements ED2 of the first to third pixel groups PXGr may not overlap the second pixel circuit units PC2 of the first to third pixel groups PXGr. The second pixel circuit units PC2 of the first pixel group PXGr may overlap some or a number of the second light emitting elements ED2 of the fourth pixel group PXGr. The second pixel circuit units PC2 of the second pixel group PXGr may overlap some or a number of the second light emitting elements ED2 of the fourth pixel group PXGr. The second pixel circuit units PC2 of the third and fourth pixel groups PXGr may overlap the second light emitting elements ED2 of the fifth pixel group PXGr. The second pixel circuit units PC2 of the fifth and sixth pixel groups PXGr may overlap the second light emitting elements ED2 of the sixth pixel group PXGr.

Figure 7:
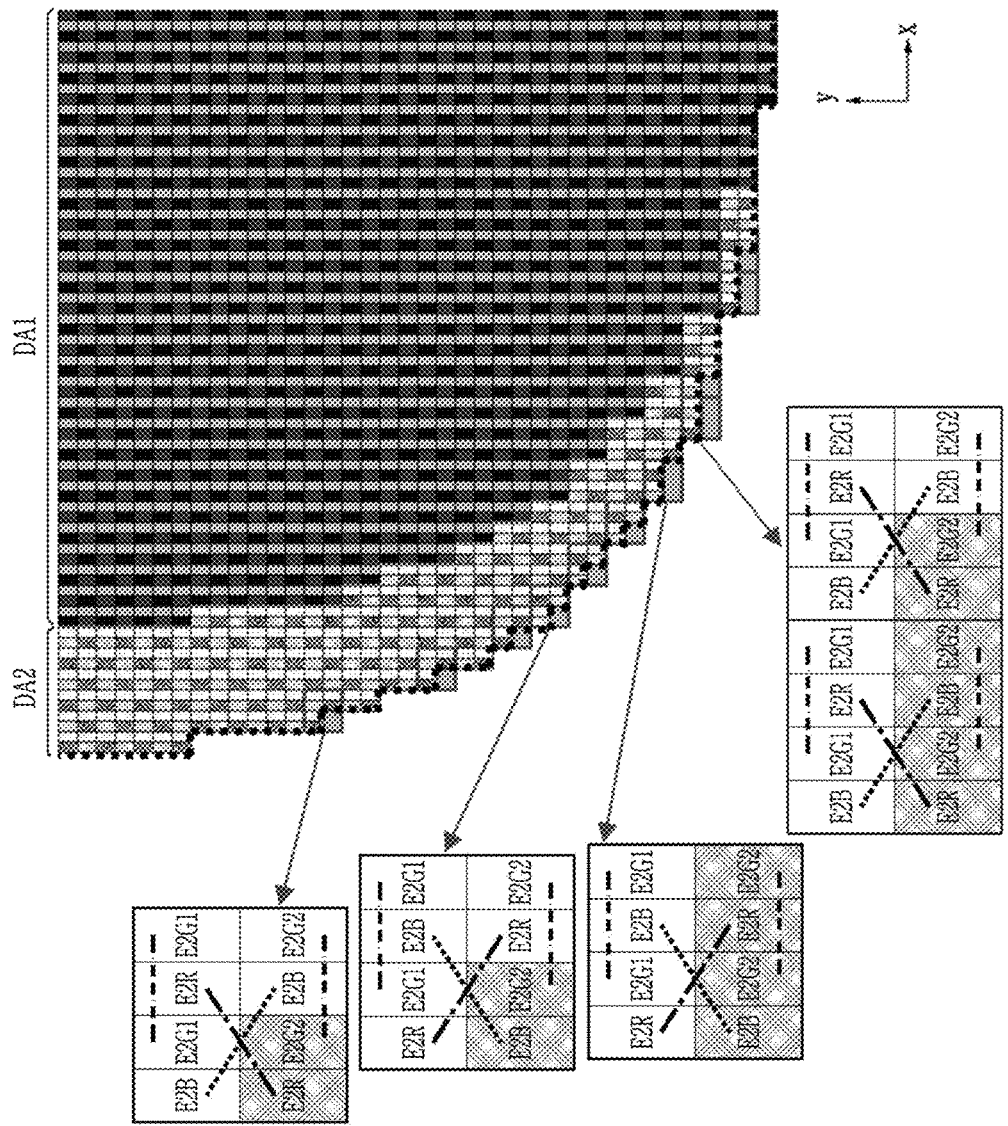
FIG. 7 shows a schematic top plan view of a disposal of light emitting elements of a corner portion in a display device according to an embodiment.

FIG. 7 shows a schematic top plan view of a disposal of light emitting elements of a corner portion in a display device according to an embodiment.

Referring to FIG. 7, a bottom left corner portion of the display area DA is illustrated in the display device according to an embodiment. Bottom right, top left, and/or top right corner portions of the display area DA may have configurations that correspond to what are shown.

The corner portion CN of the display area DA may have a shape with a substantially round edge. Regarding the round corner portion, the display area DA may include a first display area DA1 and a second display area DA2. Regarding the corner portion CN, the second display area DA2 may be positioned more outside than the first display area DA1, and the first display area DA1 and the second display area DA2 may respectively have a shape with a substantially round edge. Referring to FIG. 7, twelve second light emitting elements ED2 are disposed for each row in the first direction x in the second display area DA2, and without being limited thereto, twelve or more or less second light emitting elements ED2 may be disposed. A number of the second light emitting elements ED2 disposed in the first direction x in the second display area DA2 may be different for each row.

As described above, as the four sub-pixel circuit units P2R, P2B, P2G1, and P2G2 and the eight sub-light emitting elements E2R, E2B, E2G1, and E2G2 form one pixel group PXGr in the second display area DA2, eight sub-light emitting elements E2R, E2B, E2G1, and E2G2 (hereinafter, second light emitting element group) arranged by 4×2 may be positioned on an edge of the corner portion CN. Accordingly, two or more second light emitting elements ED2 may be shifted in the second direction y at the corner portion CN, and the round edge of the corner portion CN may be seen as a staircase.

The edge of the corner portion CN may formed to be rounder by not forming the copy light emitting elements (for example, the second light emitting elements ED2 to which a gray shade is added in FIG. 7) that are near the edge from among the copy light emitting elements or not connecting such the copy light emitting elements and the second pixel circuit unit PC2. However, the second light emitting element ED2 that is not connected to the copy light emitting element may have an increased current density compared to the second light emitting element ED2 connected to the copy light-emitting device, and the increase of the current density may cause an increase of luminance of the second light emitting element ED2. To prevent the partial increase of luminance and allow the round edge of the corner portion CN to be not visible as staircases but as a smooth curved line, some (for example, the second light emitting elements ED2 to which a gray shade is added) or a number of the second light emitting elements ED2 that are near the edge of the corner portion CN may be covered or overlapped by the light blocking layer BL (refer to FIG. 8 to FIG. 14) so that light emitted by the corresponding second light emitting elements ED2 may not be discharged outside the display device 1. A detailed configuration of the light blocking layer BL will be described in a later portion of the specification.

An even number (for example, 2, 4, 6, or 8) of second light emitting elements ED2 covered or overlapped by the light blocking layer BL may be sequentially positioned in the first direction x on the edge of the corner portion CN. For example, when one of the first sub-light emitting element E2R and the fourth sub-light emitting element E2G2 that are adjacent in the first direction x is covered or overlapped, an additional process such as a color correction between the covered or overlapped sub-light emitting element (for example, first sub-light emitting element E2R) and the sub-light emitting element (for example, fourth sub-light emitting element E2G2) that is not covered or overlapped may be needed. However, at least one second light emitting element ED2 covered or overlapped by the light blocking layer BL may be sequentially positioned in the first direction x at the edge of the corner portion CN.

FIG. 7 shows that the second light emitting elements ED2 positioned in a lower row in one light emitting element group are covered or overlapped, and the second light emitting elements ED2 positioned in an upper row may be covered or overlapped on the corner portions at the top left and the top right. The second light emitting elements ED2 positioned in the lower row may be covered or overlapped on the bottom-right corner portion.

Figure 8:
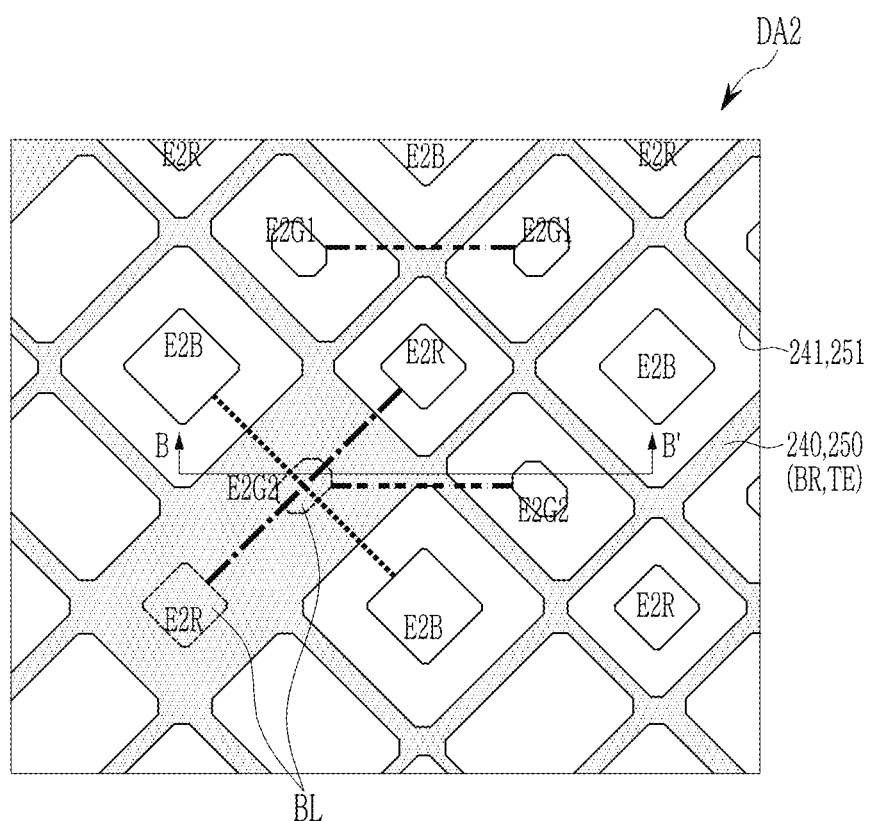
FIG. 8 shows a schematic top plan view of a display device according to an embodiment.
Figure 9:
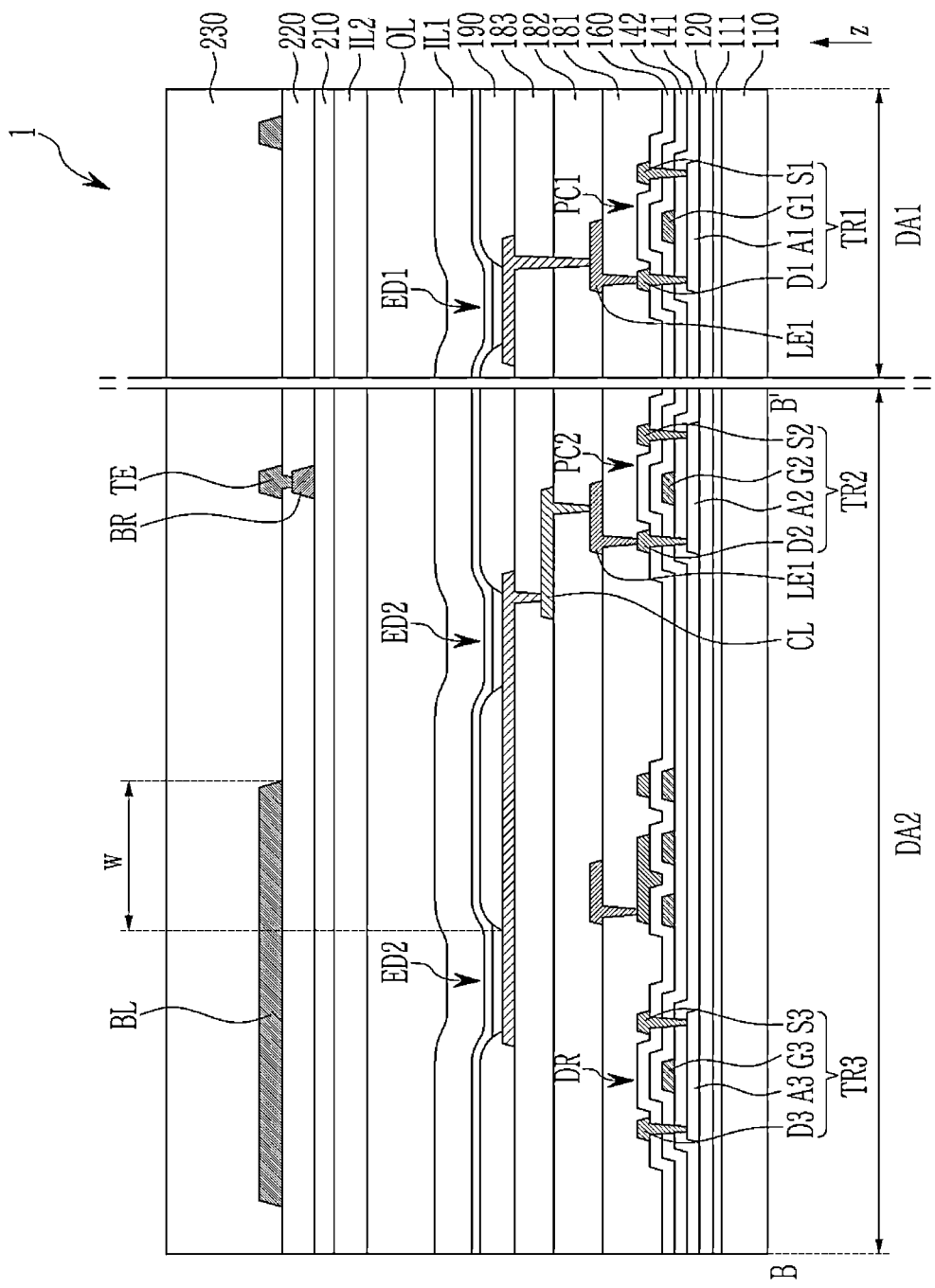
FIG. 9 and FIG. 10 show schematic cross-sectional views of a display device according to an embodiment.
Figure 10:
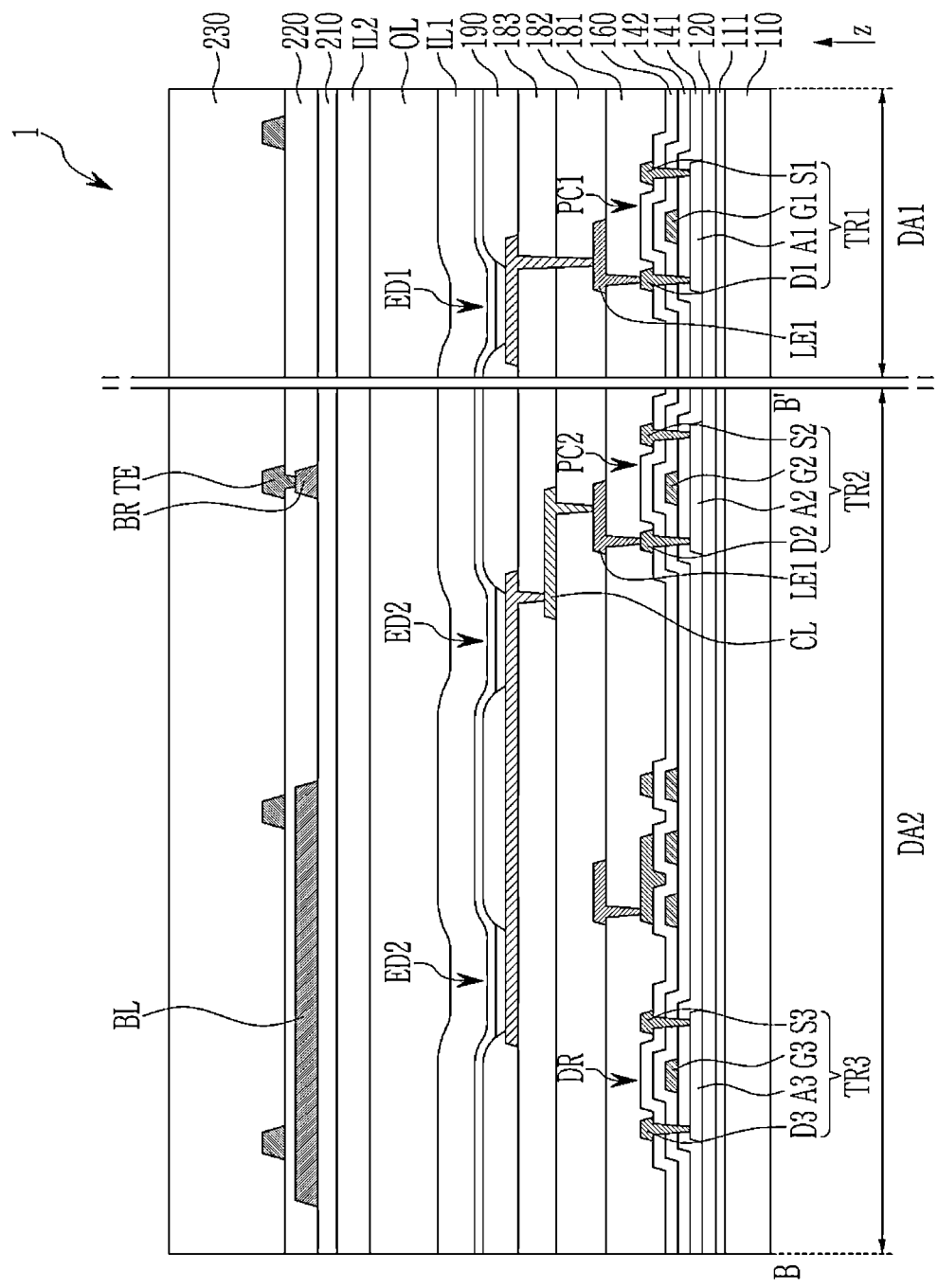

FIG. 8 shows a schematic top plan view of a display device according to an embodiment, and FIG. 9 and FIG. 10 show schematic cross-sectional views of a display device according to an embodiment.

FIG. 8 shows planar shapes and disposal of second light emitting elements ED2 and a first touch conductive layer 240 and/or a second touch conductive layer 250 on the corner portion CN of the second display area DA2. FIG. 9 and FIG. 10 respectively show a schematic cross-sectional view with respect to line B-B' of FIG. 8 and a schematic cross-sectional view of the first display area DA1.

Referring to FIG. 8, FIG. 9, and FIG. 10, a first touch conductive layer 240 including a bridge BR may be positioned on the second light emitting element ED2, and a second touch conductive layer 250 including a touch electrode TE may be positioned. The first touch conductive layer 240 and the second touch conductive layer 250 may respectively have a mesh shape. The first touch conductive layer 240 may have openings 241 overlapping the second light emitting element ED2, and the second touch conductive layer 250 may have openings 251 overlapping the second light emitting elements ED2. Accordingly, light emitted from the light emitting region of the second light emitting elements ED2 may pass through the openings 241 and 251 of the first touch conductive layer 240 and the second touch conductive layer 250 and may be discharged to the outside of the display device 1.

However, some or a number light emitting elements ED2 (the first sub-light emitting element E2R and the fourth sub-light emitting element E2G2 of FIG. 8) of the second light emitting elements ED2 that are near the edge of the corner portion CN may be covered or overlapped by the light blocking layer BL formed by the first touch conductive layer 240 or the second touch conductive layer 250. For example, the openings 241 and 251 overlapping the second light emitting elements ED2 for preventing light from being discharged are not formed in the first touch conductive layer 240 or the second touch conductive layer 250, and the light blocking layer BL may be included in the positions that correspond to at least the openings 241 and 251. Accordingly, when the corresponding second light emitting elements ED2 emit light in a like way of the second light emitting elements ED2, the discharged light is blocked by the light blocking layer BL and is not discharged to the outside of the display device 1, and they may be like the light emitting elements that are not turned on.

The light blocking layer BL may be on a same layer as the touch electrode TE as shown in FIG. 8 and FIG. 9, or may be on a same layer as the bridge BR as shown in FIG. 8 and FIG. 10. The first touch conductive layer 240 may include a light blocking layer BL together with a bridge BR, and the second touch conductive layer 250 may include a light blocking layer BL together with a touch electrode TE. The first touch conductive layer 240 and the second touch conductive layer 250 may respectively include the light blocking layer BL. When the light blocking layer BL is a second touch conductive layer 250, the light blocking layer BL may be formed with a same material or a similar material as the touch electrode TE in a same process. When the light blocking layer BL is a first touch conductive layer 240, the light blocking layer BL may be formed with a same material or a similar material as the touch electrode TE in a same process.

The light blocking layer BL may be formed to completely cover or overlap the second light emitting element ED2 when seen from the front. For example, the light discharged from the second light emitting element ED2 may be discharged in the front direction that is the third direction y and in an inclined direction with respect to the front direction. To block the light discharged in the inclined direction, a gap w between the edge of the light emitting region of the second light emitting element ED2 and the edge of the light blocking layer BL may be changeable depending on a distance between the second light emitting element ED2 and the light blocking layer BL, and for example, it may be equal to or greater than about 3.5 µm, equal to or greater than about 5 µm, or equal to or greater than about 8 µm. The light that is not blocked by the light blocking layer BL and is discharged in the inclined direction may not be discharged to the outside of the display device 1 by a total reflection caused by an interface between the display device 1 and an air layer.

The light blocking layer BL may be electrically connected to the touch electrode TE, and may be part of the touch electrode TE. The light blocking layer BL may be made of the first touch conductive layer 240 and/or the second touch conductive layer 250 so when the light blocking layer BL floats, it may be charged, and sensitivity of the adjacent touch electrode TE may be deteriorated. As the light blocking layer BL is electrically connected to the touch electrode TE, the light blocking layer BL may function as the touch electrode TE without deteriorating touch sensitivity of the touch electrode TE.

Figure 11:
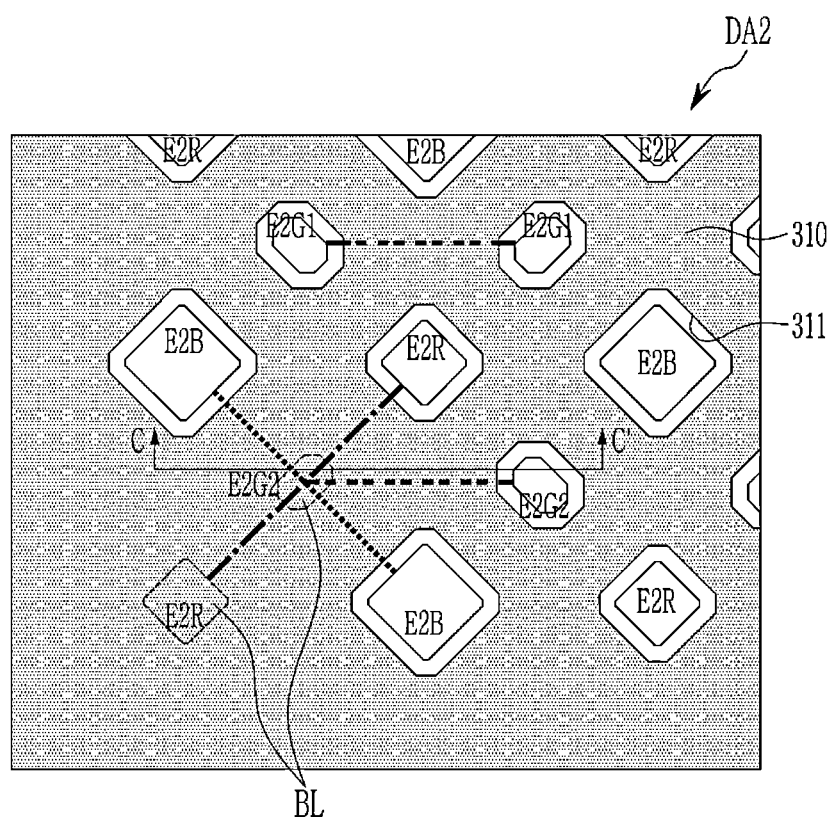
FIG. 11 shows a schematic top plan view of a display device according to an embodiment.
Figure 12:
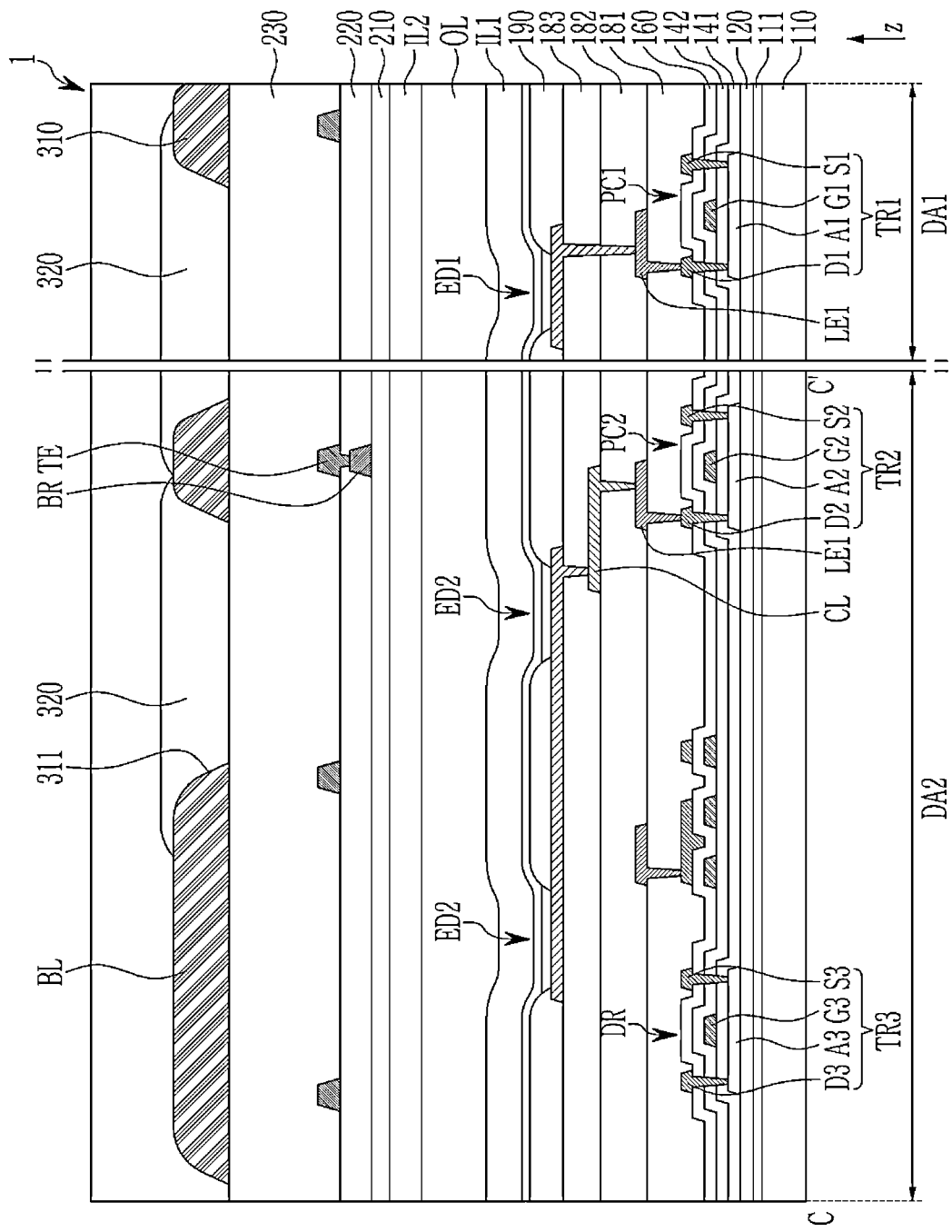
FIG. 12, FIG. 13, and FIG. 14 show schematic cross-sectional views of a display device according to an embodiment.
Figure 13:
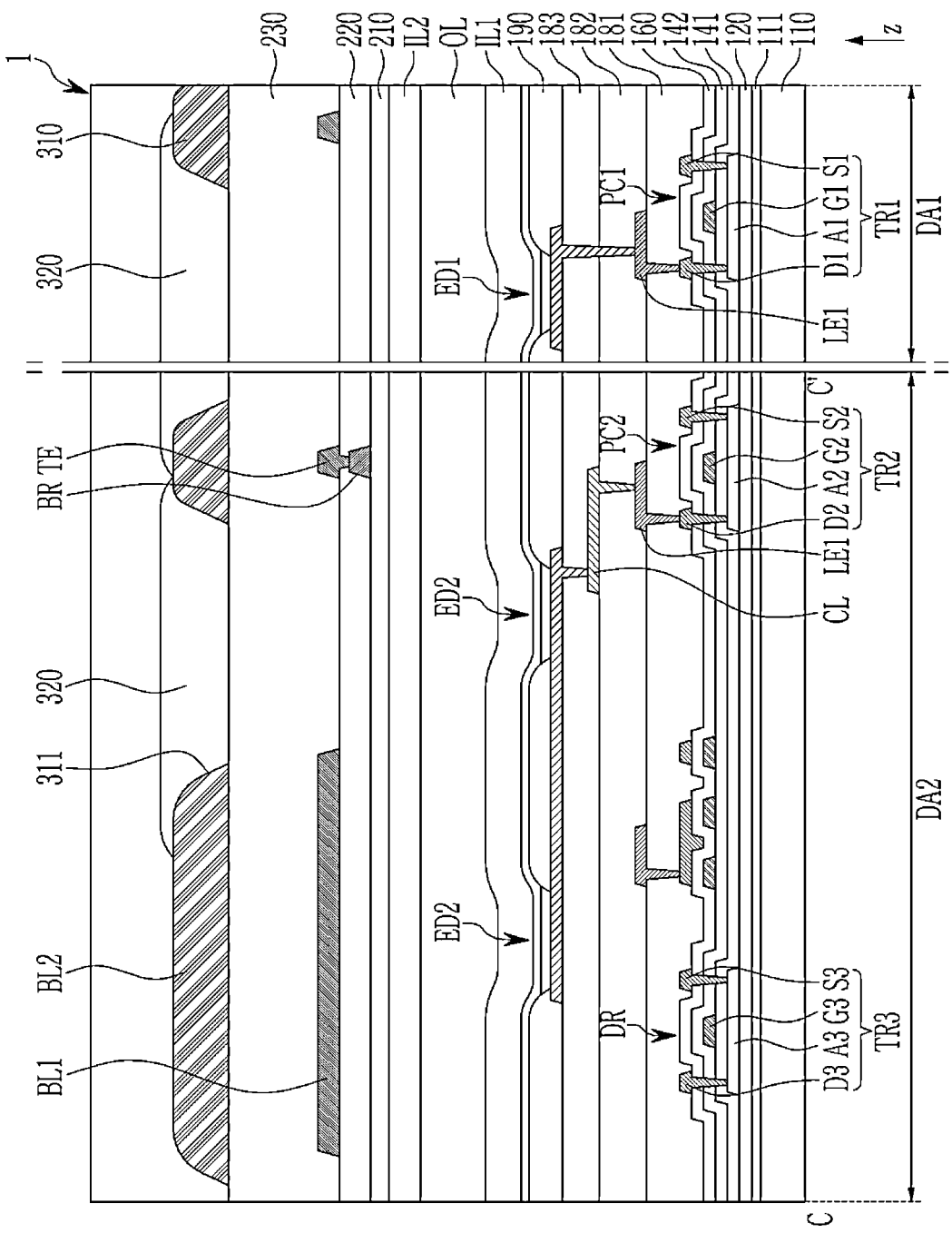
Figure 14:
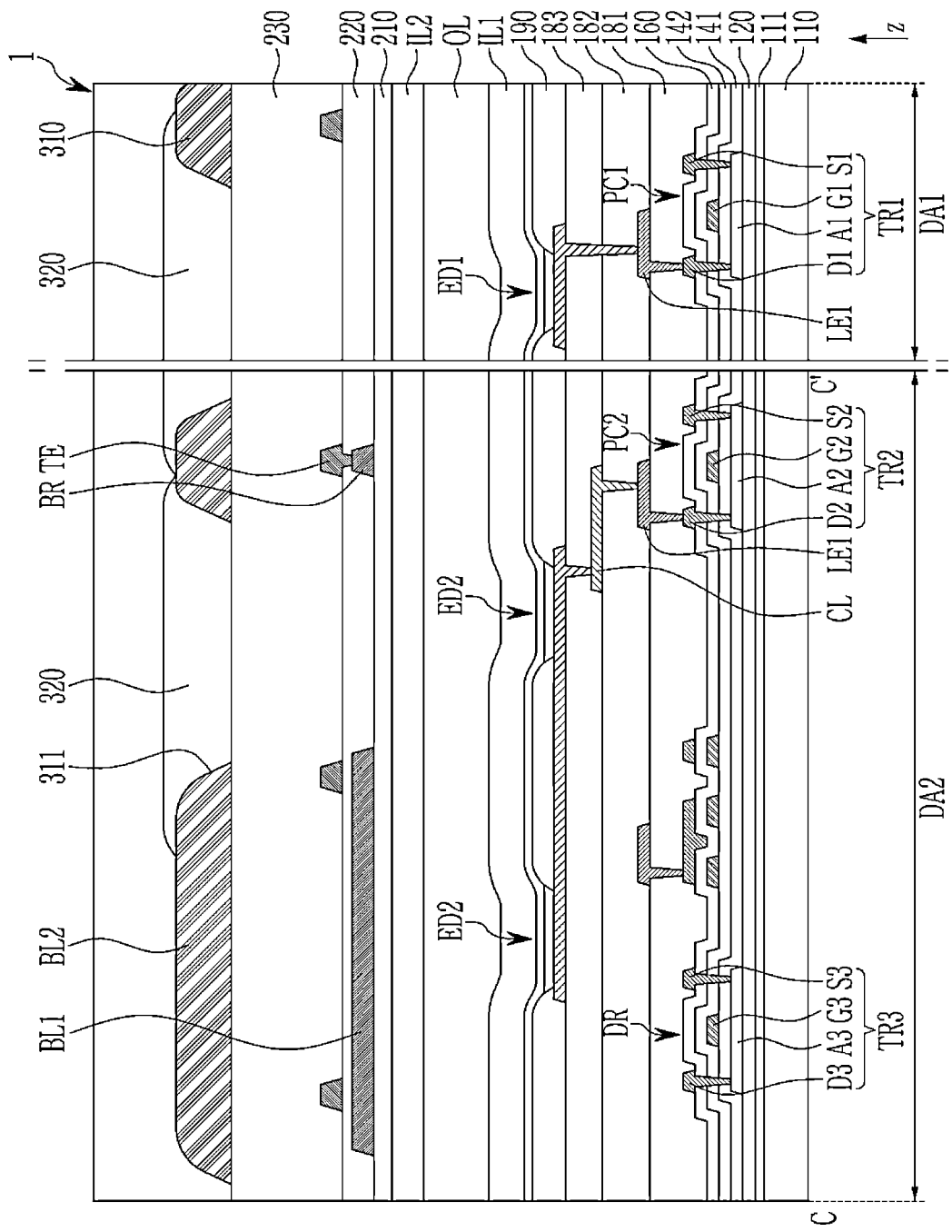

FIG. 11 shows a schematic top plan view of a display device according to an embodiment, and FIG. 12, FIG. 13, and FIG. 14 show schematic cross-sectional views of a display device according to an embodiment.

FIG. 11 illustrates planar shapes and disposal of the second light emitting elements ED2 and the light blocking member 310 on the corner portion CN of the second display area DA2. FIG. 12, FIG. 13, and FIG. 14 respectively illustrate a schematic cross-sectional view of the first display area DA1 together with a schematic cross-sectional view with respect to line C-C' of FIG. 11.

Referring to FIG. 11 and FIG. 12, a light blocking member 310 may be positioned on the second light emitting element ED2. The light blocking member 310 may have openings 311 overlapping the second light emitting element ED2. Accordingly, the light discharged from the light emitting region of the second light emitting elements ED2 may pass through the openings 311 of the light blocking member 310 and may be discharged to the outside of the display device 1.

Some or a number light emitting elements ED2, the first sub-light emitting element E2R and the fourth sub-light emitting element E2G2 of FIG. 11) of the second light emitting elements ED2 that are near the edge of the corner portion CN may be covered or overlapped by the light blocking layer BL formed by the light blocking member 310. For example, the openings 311 overlapping the second light emitting elements ED2 for blocking emission of light are formed in the light blocking member 310, and the light blocking layer BL may be included on the positions that correspond to at least the openings 311. Accordingly, when the corresponding second light emitting elements ED2 emit light in a like way of the second light emitting elements ED2, the discharged light is blocked by the light blocking layer BL and is not discharged to the outside of the display device 1, and they may be like the light emitting elements that are not turned on.

The light blocking layer BL may be part of the light blocking member 310. The light blocking layer BL may be provided by not forming the openings 311 overlapping the second light emitting elements ED2 for blocking light when the openings 311 are formed in the light blocking member 310. The light blocking layer BL may be formed to completely cover or overlap the second light emitting element ED2 when seen from the front.

Referring to FIG. 13 and FIG. 14, the display device 1 may include a first light blocking layer BL1 and a second light blocking layer BL2 overlapping the second light emitting elements ED2. The first light blocking layer BL1 may be formed to be a second touch conductive layer including a touch electrode TE as shown in FIG. 13, and it may be formed to be a second touch conductive layer including a bridge BR as shown in FIG. 14. The second light blocking layer BL2 may be formed with a light blocking member 310. For example, the overlapping light blocking layers BL1 and BL2 may be formed by a combination of the light blocking layer BL according to an embodiment described with reference to FIG. 9 or FIG. 10 and the light blocking layer BL according to an embodiment described with reference to FIG. 12.

Figure 15:
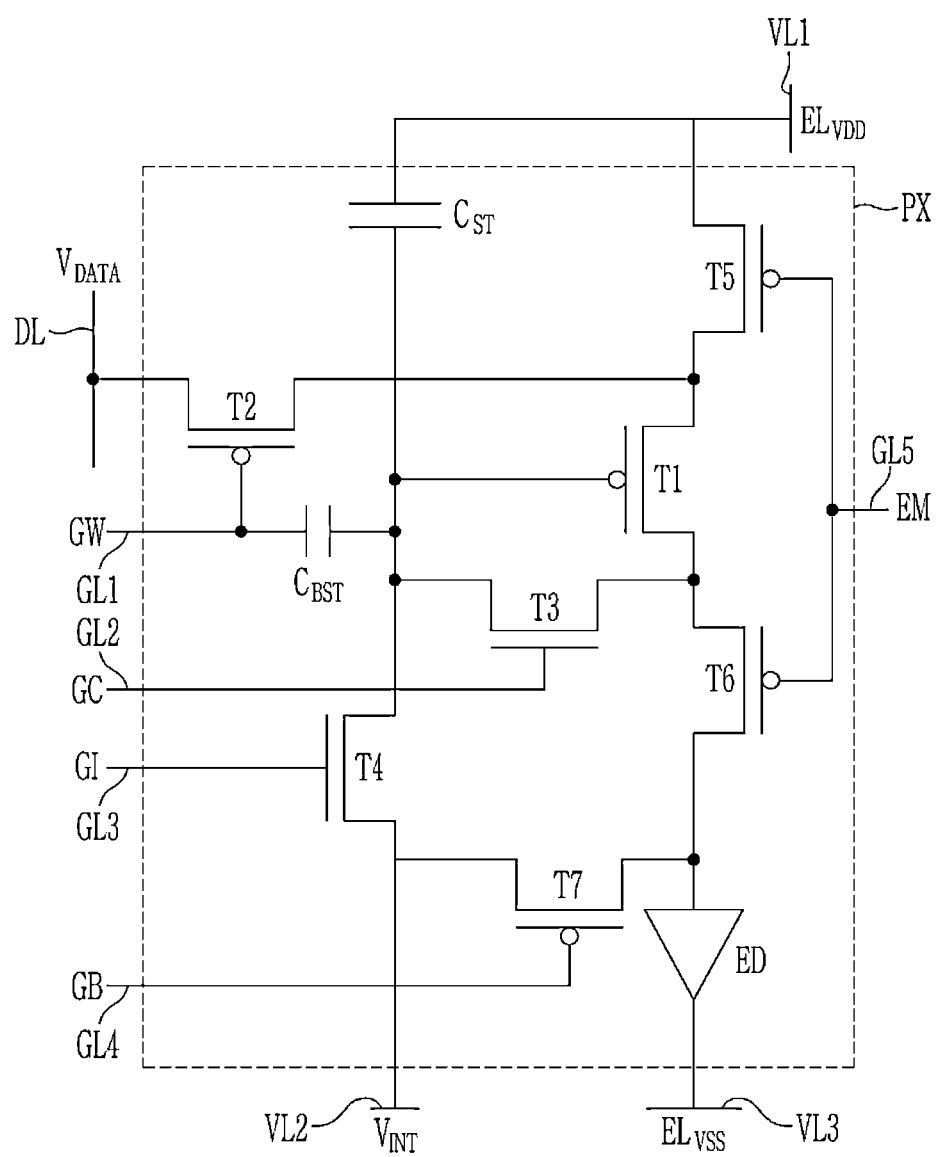
FIG. 15 shows a schematic diagram of an equivalent circuit of a pixel of a display device according to an embodiment.

FIG. 15 shows a schematic diagram of an equivalent circuit of a pixel of a display device according to an embodiment.

Referring to FIG. 15, one pixel PX may include transistors T1 to T7 connected to signal lines GL1 to GL5, DL, and VL1 to VL3, a storage capacitor CST, a boost capacitor CBST, and a light emitting element ED that may be a light emitting diode (LED). The light emitting element ED may be the above-described first light emitting element ED1 or the second light emitting element ED2. For example, the light emitting element ED may be one first light emitting element ED1, and the light emitting element ED may be second light emitting elements ED2 connected in parallel to each other. The above-described first pixel circuit unit PC1 and second pixel circuit unit PC2 may correspond to pixel circuits except for the light emitting element ED in FIG. 15.

The signal lines GL1 to GL5, DL, and VL1 to VL3 may include gate lines GL1 to GL5, a data line DL, and voltage lines VL1 to VL3. The gate lines GL1 to GL5 may be electrically connected to a gate driver, and the data line DL may be electrically connected to a data driver. The gate lines GL1 to GL5 may include a scan line GL1, an inverted scan line GL2, an initialization control line GL3, a bypass control line GL4, and an emission control line GL5. The voltage lines VL1 to VL3 may include a driving voltage line VL1, an initialization voltage line VL2, and a common voltage line VL3. The driving voltage line VL1, the initialization voltage line VL2, and the common voltage line VL3 may respectively be connected to a voltage generator. The transistors T2 to T7 may respectively receive gate signals through the gate lines GL1 to GL5.

The scan line GL1 may transit a scan signal GW to the switching transistor T2. The inverted scan line GL2 may transmit an inverted scan signal GC to the compensation transistor T3. The scan signal GW and the inverted scan signal GC may have opposite polarities to each other. For example, when a high voltage is applied to the scan line GL1, a low voltage may be applied to the inverted scan line GL2.

The initialization control line GL3 may transmit an initialization control line GI to the initialization transistor T4. The bypass control line GL4 may transmit a bypass signal GB to the bypass transistor T7. The bypass control line GL4 may be the scan line GL1 connected to the pixel PX that is adjacent in the second direction y. The emission control line GL5 may transmit the emission control signal EM to the operation control transistor T5 and the emission control transistor T6.

The data line DL may transmit the data voltage VDATA. The driving voltage line VL1 may transmit a driving voltage ELVDD, the initialization voltage line VL2 may transmit an initialization voltage VINT, and the common voltage line VL3 may transmit a common voltage ELVSS. Luminance of the light emitting element ED may be adjusted by adjusting the driving current applied to the light emitting element ED according to the size of the data voltage VDATA applied to the pixel PX. The driving voltage ELVDD, the initialization voltage VINT, and the common voltage ELVSS may respectively be a DC voltage of a given level.

The transistors T1 to T7 may include a driving transistor T1, a switching transistor T2, a compensation transistor T3, an initialization transistor T4, an operation control transistor T5, an emission control transistor T6, and a bypass transistor T7.

The driving transistor T1 may be a p-type transistor, and may include a polycrystalline semiconductor. The driving transistor T1 is a transistor for adjusting the size of the driving current output to an anode of the light emitting element ED according to the data voltage VDATA applied to a gate electrode of the driving transistor T1. The gate electrode of the driving transistor T1 is connected to a first electrode of the storage capacitor CST. A first electrode of the driving transistor T1 is connected to a second electrode of the switching transistor T2, passes through the operation control transistor T5, and is connected to the driving voltage line VL1. A second electrode of the driving transistor T1 passes through the emission control transistor T6 and is connected to an anode of the light emitting element ED.

The switching transistor T2 may be a p-type transistor and may include a polycrystalline semiconductor. A gate electrode of the switching transistor T2 is connected to the scan line GL1, and is connected to a first electrode of the boost capacitor CBST. A first electrode of the switching transistor T2 is connected to the data line DL, and a second electrode of the switching transistor T2 is connected to the first electrode of the driving transistor T1. When the switching transistor T2 is turned on by a gate-on voltage low voltage of the scan signal GW transmitted through the scan line GL1, the data voltage VDATA transmitted through the data line DL may be transmitted to the first electrode of the driving transistor T1.

The compensation transistor T3 may be an n-type transistor and may include an oxide semiconductor. The compensation transistor T3 may electrically connect the second electrode and the gate electrode of the driving transistor T1. As a result, a compensation voltage generated when the data voltage VDATA passes through the driving transistor T1 may be transmitted to the first electrode of the storage capacitor CST. A gate electrode of the compensation transistor T3 is connected to the inverted scan line GL2, and a first electrode of the compensation transistor T3 is connected to the second electrode of the driving transistor T1. A second electrode of the compensation transistor T3 is connected to the first electrode of the storage capacitor CST, the gate electrode of the driving transistor T1, and the second electrode of the boost capacitor CBST. When the compensation transistor T3 is turned on by a gate-on voltage high voltage of the inverted scan signal GC received through the inverted scan line GL2, the compensation transistor T3 connects the gate electrode of the driving transistor T1 and the second electrode of the driving transistor T1. The voltage applied to the gate electrode of the driving transistor T1 is stored in the storage capacitor CST, and the storage capacitor CST may maintain the voltage at the gate electrode of the driving transistor T1 for one frame.

The initialization transistor T4 may be an n-type transistor and may include an oxide semiconductor. A gate electrode of the initialization transistor T4 is connected to the initialization control line GL3. The initialization transistor T4 may initialize the gate electrode of the driving transistor T1 and the first electrode of the storage capacitor CST with the initialization voltage VINT. The gate electrode of the initialization transistor T4 is connected to the initialization control line GL3, and the first electrode of the initialization transistor T4 is connected to the initialization voltage line VL2. A second electrode of the initialization transistor T4 is connected to the first electrode of the storage capacitor CST, the gate electrode of the driving transistor T1, and the second electrode of the boost capacitor CBST. The initialization transistor T4 is turned on by the gate-on voltage high voltage of the initialization control line GI received through the initialization control line GL3, and it may transmit the initialization voltage VINT to the gate electrode of the driving transistor T1 and the first electrode of the storage capacitor CST.

The operation control transistor T5 may be a p-type transistor, and may include a polycrystalline semiconductor. The operation control transistor T5 may transmit the driving voltage ELVDD to the driving transistor T1. A gate electrode of the operation control transistor T5 is connected to the emission control line GL5, a first electrode of the operation control transistor T5 is connected to the driving voltage line VL1, and a second electrode of the operation control transistor T5 is connected to the first electrode of the driving transistor T1.

The emission control transistor T6 may be a p-type transistor and may include a polycrystalline semiconductor. The emission control transistor T6 may transmit the driving current output by the driving transistor T1 to the light emitting element ED. A gate electrode of the emission control transistor T6 is connected to the emission control line GL5, a first electrode of the emission control transistor T6 is connected to the second electrode of the driving transistor T1, and a second electrode of the emission control transistor T6 is connected to the anode of the light emitting element ED.

The bypass transistor T7 may be a p-type transistor and may include a polycrystalline semiconductor. The bypass transistor T7 may initialize the anode of the light emitting element ED. A gate electrode of the bypass transistor T7 is connected to the bypass control line GL4, a first electrode of the bypass transistor T7 is connected to the anode of the light emitting element ED, and a second electrode of the bypass transistor T7 is connected to the initialization voltage line VL2. When the bypass transistor T7 is turned on by the gate-on voltage low voltage of the bypass signal GB, the initialization voltage VINT may be applied to the anode of the light emitting element ED.

A second electrode of the storage capacitor CST is connected to the driving voltage line VL1. A cathode of the light emitting element ED is connected to the common voltage line VL3 for transmitting the common voltage ELVSS.

As described above, the driving transistor T1 may include a polycrystalline semiconductor, and the compensation transistor T3 and the initialization transistor T4 may include oxide semiconductors. The switching transistor T2, the operation control transistor T5, the emission control transistor T6, and the bypass transistor T7 may include polycrystalline semiconductors. Therefore, the driving transistor T1 may have high electron mobility, and may reduce leakage currents of the compensation transistor T3 and the initialization transistor T4. By allowing the compensation transistor T3 and the initialization transistor T4 to include a semiconductor material that is different from the driving transistor T1, they may be driven in a further stable way, and reliability may be improved. At least one of the switching transistor T2, the operation control transistor T5, the emission control transistor T6, and the bypass transistor T7 may include an oxide semiconductor.

When a high voltage is applied to the scan line GL1, a low voltage may be applied to the inverted scan line GL2, and when a low voltage is applied to the scan line GL1, a high voltage may be applied to the inverted scan line GL2. As the inverted scan signal GC applied to the inverted scan line GL2 is an inverted signal of the scan signal GW applied to the scan line GL1, the gate voltage of the driving transistor T1 may be lowered after the data voltage is programmed. On the contrary, the scan signal GW may increase the gate voltage of the driving transistor T1. As the boost capacitor CBST is positioned between the scan line GL1 and the gate electrode of the driving transistor T1, the gate voltage of the driving transistor T1 may be stabilized. The boost capacitor CBST may compensate the increase or reduction of the gate voltage of the driving transistor T1 when the inverted scan signal GC is changed to the high voltage or the low voltage.

Differing from what is shown according to an embodiment, the compensation transistor T3 and the initialization transistor T4 may include polycrystalline semiconductors, and may be p-type transistors. The switching transistor T2 and the compensation transistor T3 may receive the same gate signal, and the pixel PX may not include the boost capacitor CBST.

According to the shown embodiment, the pixel PX may include seven transistors T1 to T7, one storage capacitor CST, and one boost capacitor CBST, but the number of the transistors, the number of the capacitors, and connection relationships thereof are modifiable in many ways.

While the disclosure has been described in connection with the disclosed embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a display area that includes a first display area and a second display area adjacent to each other;
   a gate driver that includes a driving circuit, at least part of the driving circuit being disposed in the second display area;
   first pixel circuit units disposed in the first display area;
   first light emitting elements disposed in the first display area and electrically connected to the first pixel circuit units;
   second pixel circuit units disposed in the second display area;
   second light emitting elements disposed in the second display area and two or more of the second light emitting elements are electrically connected to one of the second pixel circuit units; and
   a light blocking layer overlapping at least one of the second light emitting elements in a plan view.

2. The display device of claim 1, wherein
   the display area includes a corner portion, and
   the at least one second light emitting element is disposed near an edge of the corner portion of the display area.

3. The display device of claim 2, wherein the at least one second light emitting element includes adjacent second light emitting elements in a direction from the edge of the corner portion of the display area.

4. The display device of claim 3, wherein the light blocking layer overlaps the adjacent second light emitting elements in a plan view, the light blocking layer completely covering the adjacent second light emitting elements.

5. The display device of claim 2, wherein the at least one second light emitting element includes adjacent even-numbered second light emitting elements in the first direction from the edge of the corner portion of the display area.

6. The display device of claim 1, wherein the at least one second light emitting element includes at least one of the two or more second light emitting elements electrically connected to a same second pixel circuit unit.

7. The display device of claim 1, wherein the second light emitting elements display a same color.

8. The display device of claim 1, wherein the at least one second light emitting element overlaps the driving circuit in a plan view.

9. The display device of claim 1, wherein the second light emitting elements are disposed between a substrate and the light blocking layer.

10. The display device of claim 1, further comprising:
    a display unit including:
      a substrate;
      the first light-emitting elements, and
      the second light emitting elements; and
    a touch unit disposed on the display unit,
    wherein the touch unit includes a touch conductive layer including the light blocking layer.

11. The display device of claim 10, wherein
    the touch unit includes:
      a first insulating layer;
      a first touch conductive layer including a bridge disposed on the first insulating layer and electrically connecting touch electrodes;
      a second insulating layer disposed on the first touch conductive layer; and
      a second touch conductive layer disposed on the second insulating layer and including the touch electrodes and the light blocking layer.

12. The display device of claim 11, wherein the light blocking layer is part of one of the touch electrodes or is electrically connected to the one of the touch electrodes.

13. The display device of claim 10, wherein
    the touch unit includes:
      a first insulating layer;
      a first touch conductive layer including a bridge disposed on the first insulating layer and electrically connecting touch electrodes and the light blocking layer;
      a second insulating layer disposed on the first touch conductive layer; and
      a second touch conductive layer disposed on the second insulating layer and including the touch electrodes.

14. The display device of claim 13, wherein the light blocking layer is electrically connected to one of the touch electrodes.

15. The display device of claim 1, further comprising:
    a display unit including:
      a substrate;
      the first light-emitting elements; and
      the second light emitting elements; and
    an anti-reflector disposed on the display unit,
    wherein the anti-reflector includes a light blocking member including the light blocking layer.

16. A display device comprising:
    a first display area and a second display area disposed outside of the first display area;
    a driving circuit including a portion overlapping the second display area in a plan view;
    a first light emitting element disposed in the first display area;
    second light emitting elements disposed in the second display area and electrically connected to each other; and
    a light blocking layer overlapping at least one of the second light emitting elements in a plan view.

17. The display device of claim 16, wherein the second light emitting elements overlap the driving circuit in a plan view.

18. The display device of claim 16, wherein
    the second display area includes a corner portion, and
    the second light emitting elements are disposed near an edge of the corner portion of the second display area.

19. The display device of claim 16, further comprising:
    a touch conductive layer disposed on the first light emitting element and the second light emitting elements,
    wherein the touch conductive layer includes the light blocking layer.

20. The display device of claim 16, further comprising:
    a light blocking member disposed on the first light emitting element and the second light emitting elements,
    wherein the light blocking member includes the light blocking layer.

21. The display device of claim 1, wherein the driving circuit is a gate driver.

22. The display device of claim 1, wherein the first light emitting elements are disposed between the first pixel circuit units and touch unit.

* * * * *